(12) United States Patent
Nam

(10) Patent No.: US 11,194,359 B2
(45) Date of Patent: Dec. 7, 2021

(54) CLOCK MONITORING CIRCUIT AND INTEGRATED CIRCUIT INCLUDING THE SAME

(71) Applicant: SAMSUNG ELECTRONICS CO., LTD., Suwon-si (KR)

(72) Inventor: Hyunseok Nam, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/815,503

(22) Filed: Mar. 11, 2020

(65) Prior Publication Data

US 2020/0393867 A1    Dec. 17, 2020

(30) Foreign Application Priority Data

Jun. 12, 2019    (KR) ........................ 10-2019-0069557

(51) Int. Cl.
| | | |
|---|---|---|
| *G06F 1/08* | (2006.01) | |
| *H03L 7/097* | (2006.01) | |
| *H03L 7/089* | (2006.01) | |
| *G06F 1/10* | (2006.01) | |

(52) U.S. Cl.
CPC .................. *G06F 1/08* (2013.01); *G06F 1/10* (2013.01); *H03L 7/089* (2013.01); *H03L 7/097* (2013.01)

(58) Field of Classification Search
CPC ............ H02M 1/32; H02M 1/36; H02M 1/38; H02M 1/1566; H02M 3/156; H02M 3/1563; H02M 3/157; H02M 3/158; G06F 1/08; G06F 1/10; G06F 1/105; H03L 7/083; H03L 7/085; H03L 7/087; H03L 7/089; H03L 7/0891; H03L 7/0893; H03L 7/0895; H03L 7/0896; H03L 7/0898; H03L 7/097
See application file for complete search history.

(56) References Cited

U.S. PATENT DOCUMENTS

| | | |
|---|---|---|
| 6,552,578 B1 | 4/2003 | Cheung et al. |
| 7,180,346 B2 | 2/2007 | Lee |
| 9,503,104 B2 | 11/2016 | Erdogan et al. |
| 9,785,156 B2 | 10/2017 | Sato |
| 2008/0129358 A1 | 6/2008 | Monma et al. |
| 2008/0172202 A1* | 7/2008 | Nakazato ............. G01D 5/2073 702/151 |
| 2013/0320907 A1 | 12/2013 | Koo |
| 2015/0365094 A1 | 12/2015 | Erdogan et al. |
| 2017/0111036 A1 | 4/2017 | Seo et al. |
| 2019/0131962 A1* | 5/2019 | Jeong ....................... H03H 7/06 |

* cited by examiner

*Primary Examiner* — Diana J. Cheng
(74) *Attorney, Agent, or Firm* — Volentine, Whitt & Francos, PLLC

(57) ABSTRACT

A clock monitoring circuit and an integrated circuit including the clock monitoring circuit, the clock monitoring circuit including a first duty ratio detector that detects a variation of a duty ratio of a clock signal based on a first upper limit voltage and a first lower limit voltage, a second duty ratio detector that detects a variation of a duty ratio of a monitoring clock signal based on a second upper limit voltage and a second lower limit voltage, and a first frequency detector that detects a frequency variation of the clock signal using the second upper limit voltage and the second lower limit voltage.

20 Claims, 15 Drawing Sheets

CLOCK MONITORING CIRCUIT AND INTEGRATED CIRCUIT INCLUDING THE SAME

CROSS-REFERENCE TO RELATED APPLICATION

A claim for priority under 35 U.S.C. § 119 is made to Korean Patent Application No. 10-2019-0069557, filed on Jun. 12, 2019, in the Korean Intellectual Property Office, the entirety of which is incorporated herein by reference.

BACKGROUND

The inventive concepts herein relate to a clock monitoring circuit, and more particularly to a clock monitoring circuit and an integrated circuit including the same.

Electronic circuits and electronic devices typically include a power management integrated circuit which converts an input voltage received from the outside to supply a source voltage. The power management integrated circuit receives the input voltage and provides various source voltages suitable for internal operation of the electronic circuits/devices on the basis of the received input voltage.

Various semiconductor devices including a power management integrated circuit use a clock signal for a switching operation. Various semiconductor devices which operate based on the clock signal may need to be controlled in order for the clock signal to maintain a certain frequency and a certain duty ratio.

SUMMARY

Embodiments of the inventive concept provides a clock monitoring circuit and an integrated circuit including the same, that detect a duty ratio variation of a clock signal and a frequency of the clock signal to detect an abnormal state of the clock signal.

Embodiments of the inventive concepts provide a clock monitoring circuit including a first duty ratio detector that detects a variation of a duty ratio of a clock signal by using a first upper limit voltage and a first lower limit voltage, a second duty ratio detector that detects a variation of a duty ratio of a monitoring clock signal by using a second upper limit voltage and a second lower limit voltage, and a first frequency detector that detects a frequency variation of the clock signal by using the second upper limit voltage and the second lower limit voltage. The first upper limit voltage has a level as high as a first upper limit level with respect to a voltage corresponding to the duty ratio of the clock signal, and the first lower limit voltage has a level as low as a first lower limit level with respect to the voltage corresponding to the duty ratio of the clock signal. The second upper limit voltage has a level as high as a second upper limit level with respect to a voltage corresponding to the duty ratio of the monitoring clock signal, and the second lower limit voltage has a level as low as a second lower limit level with respect to the voltage corresponding to the duty ratio of the monitoring clock signal.

Embodiments of the inventive concepts also provide an integrated circuit including a clock monitoring circuit for monitoring a characteristic of a clock signal, the clock monitoring circuit including a first duty ratio detector that generates and outputs a first duty detection signal based on a variation of a duty ratio of a first clock signal by using a first upper limit voltage and a first lower limit voltage, a second duty ratio detector that generates and outputs a second duty detection signal based on a variation of a duty ratio of a monitoring clock signal by using a second upper limit voltage and a second lower limit voltage, and a first frequency detector that outputs a first frequency detection signal based on a frequency variation of the first clock signal by using the second upper limit voltage and the second lower limit voltage. The first upper limit voltage has a level as high as a first upper limit level with respect to a voltage corresponding to the duty ratio of the first clock signal, and the first lower limit voltage has a level as low as a first lower limit level with respect to the voltage corresponding to the duty ratio of the first clock signal. The second upper limit voltage has a level as high as a second upper limit level with respect to a voltage corresponding to the duty ratio of the monitoring clock signal, and the second lower limit voltage has a level as low as a second lower limit level with respect to the voltage corresponding to the duty ratio of the monitoring clock signal.

Embodiments of the inventive concepts still further provide an integrated circuit including a clock generator that generates a clock signal and a clock monitoring circuit that monitors a duty ratio and a frequency of the clock signal. The clock monitoring circuit includes a first duty ratio detector that detects a variation of a duty ratio of the clock signal, a second duty ratio detector that detects a variation of a duty ratio of a monitoring clock signal, a first frequency detector that detects a frequency variation of the clock signal, and a second frequency detector that detects a frequency variation of the monitoring clock signal. The second frequency detector detects the frequency variation of the monitoring clock signal by using a first upper limit voltage and a first lower limit voltage each generated by the first duty ratio detector. The first frequency detector detects the frequency variation of the clock signal by using a second upper limit voltage and a second lower limit voltage each generated by the second duty ratio detector.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
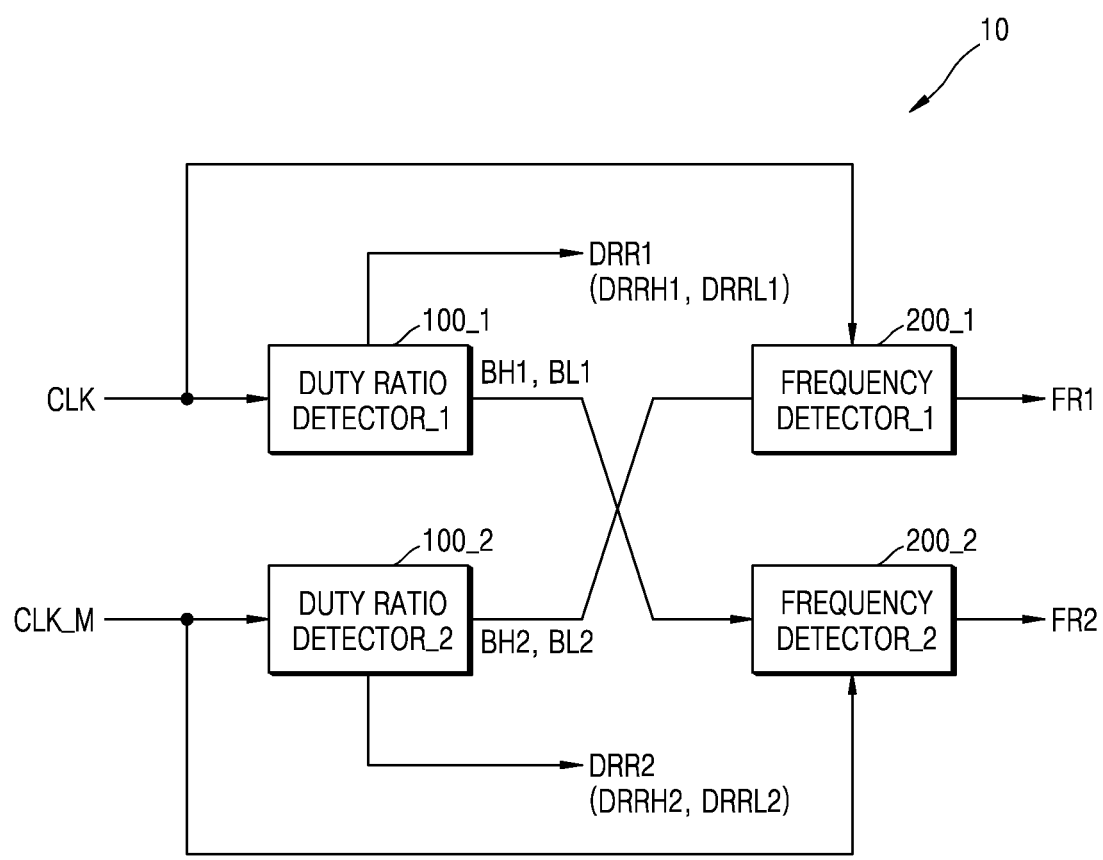
FIG. 1 illustrates a block diagram of a clock monitoring circuit according to an example embodiment of the inventive concepts.

FIG. 1 illustrates a block diagram of a clock monitoring circuit 10 according to an example embodiment of the inventive concepts.

Referring to FIG. 1, the clock monitoring circuit 10 may include a first duty ratio detector 100_1, a second duty ratio detector 100_2, a first frequency detector 200_1, and a second frequency detector 200_2. The first duty ratio detector 100_1 may be a circuit for detecting a duty ratio variation of a clock signal CLK, and the first frequency detector 200_1 may be a circuit for detecting a frequency variation of the clock signal CLK. The second duty ratio detector 100_1 may be a circuit for detecting a duty ratio variation of a monitoring clock signal CLK_M, and the second frequency detector 200_2 may be a circuit for detecting a frequency variation of the monitoring clock signal CLK_M.

In an example embodiment, the monitoring clock signal CLK_M may be a signal which is a criterion of the clock signal CLK. For example, a duty ratio (for example, 50%) of the monitoring clock signal CLK_M may be a reference duty ratio of the clock signal CLK, and a frequency of the monitoring clock signal CLKM may be a reference frequency of the clock signal CLK. Therefore, the clock monitoring circuit 10 may detect whether a degree of variation of a duty ratio of the clock signal CLK with respect to a duty ratio of the monitoring clock signal CLK_M is greater than an upper limit or less than a lower limit, and may detect whether a degree of variation of a frequency of the clock signal CLK with respect to a frequency of the monitoring clock signal CLK_M is greater than an upper limit or less than a lower limit.

The first duty ratio detector 100_1 may output a first duty detection signal DRR1 based on the duty ratio variation of the clock signal CLK. In an example embodiment, the first duty detection signal DRR1 may include a first signal DRRH1 and a second signal DRRL1. The first signal DRRH1 may be a signal having a logic level which varies when the duty ratio of the clock signal CLK is greater than an upper limit, and the second signal DRRL2 may be a signal having a logic level which varies when the duty ratio of the clock signal CLK is less than a lower limit. Alternatively, in an example embodiment, the first duty detection signal DRR1 may be configured as a single signal and may be a signal having a logic level which varies when the duty ratio of the clock signal CLK is greater than the upper limit or less than the lower limit.

The first duty ratio detector 100_1 may generate a voltage corresponding to the duty ratio of the clock signal CLK. The first duty ratio detector 100_1 may generate a first upper limit voltage BH1 having a level as high as a first upper limit level with respect to the voltage corresponding to the duty ratio of the clock signal CLK, and may generate a first lower limit voltage BL1 having a level as low as a first lower limit level with respect to the voltage corresponding to the duty ratio of the clock signal CLK. In an example embodiment, the first upper limit level and the first lower limit level may have the same value, but are not limited thereto and may have different values.

The second duty ratio detector 100_2 may output a second duty detection signal DRR2 based on the duty ratio variation of the monitoring clock signal CLK_M. In an example embodiment, the second duty detection signal DRR2 may include a first signal DRRH2 and a second signal DRRL2. The first signal DRRH2 may be a signal having a logic level which varies when the duty ratio of the monitoring clock signal CLK_M is greater than the upper limit, and the second signal DRRL2 may be a signal having a logic level which varies when the duty ratio of the monitoring clock signal CLK_M is less than the lower limit. Alternatively, in an example embodiment, the second duty detection signal DRR2 may be configured as a single signal and may be a signal having a logic level which varies when the duty ratio of the monitoring clock signal CLK_M is greater than the upper limit or less than the lower limit.

The second duty ratio detector 100_2 may generate a voltage corresponding to the duty ratio of the monitoring clock signal CLK_M. The second duty ratio detector 100_2 may generate a second upper limit voltage BH2 having a level as high as a second upper limit level with respect to the voltage corresponding to the duty ratio of the monitoring clock signal CLK_M, and may generate a second lower limit voltage BL2 having a level as low as a second lower limit level with respect to the voltage corresponding to the duty ratio of the monitoring clock signal CLK_M. In an example embodiment, the second upper limit level may have the same value as that of the first lower limit level, and the second lower limit level may have the same value as that of the first lower limit level. However, the inventive concepts are not limited thereto, and the second upper limit level may have a value different than that of the first lower limit level and the second lower limit level may have a value different than that of the first lower limit level. In an example embodiment, the second upper limit level and the second lower limit level may have the same value, but are not limited thereto and may have different values.

The first frequency detector 200_1 may output a first frequency detection signal FR1 based on a frequency variation of the clock signal CLK. In an example embodiment, the first frequency detection signal FR1 may be a signal having a logic level which varies when a frequency of the clock signal CLK is greater than an upper limit or less than a lower limit.

The first frequency detector 200_1 may receive the second upper limit voltage BH2 and the second lower limit voltage BL2 from the second duty ratio detector 100_2. The first frequency detector 200_1 may detect the frequency variation of the clock signal CLK and may generate the first frequency detection signal FR1 by using the second upper limit voltage BH2 and the second lower limit voltage BL2. In an example embodiment, the first frequency detector 200_1 may generate a frequency detection voltage corresponding to the frequency of the clock signal CLK and may compare the frequency detection voltage with the second upper limit voltage BH2 and the second lower limit voltage BL2 to generate the first frequency detection signal FR1.

The second frequency detector 200_2 may output a second frequency detection signal FR2 based on a frequency variation of the monitoring clock signal CLK_M. In an example embodiment, the second frequency detection signal FR2 may be a signal having a logic level which varies when a frequency of the monitoring clock signal CLK_M is greater than the upper limit or less than the lower limit.

The second frequency detector 200_2 may receive the first upper limit voltage BH1 and the first lower limit voltage BL1 from the first duty ratio detector 100_1. The second frequency detector 200_2 may detect the frequency variation of the monitoring clock signal CLK_M and may generate the second frequency detection signal FR2 by using the first upper limit voltage BH1 and the first lower limit voltage BL1. In an example embodiment, the second frequency detector 200_2 may generate a frequency detection voltage corresponding to the frequency of the monitoring clock signal CLK_M and may compare the frequency detection voltage with the first upper limit voltage BH1 and the first lower limit voltage BL1 to generate the second frequency detection signal FR2.

The clock monitoring circuit 10 according to the inventive concepts may preferentially detect the duty ratio variation of each of the clock signal CLK and the monitoring clock signal CLK_M, and may subsequently detect the frequency variation of each of the clock signal CLK and the monitoring clock signal CLK_M, thereby detecting an abnormal state of each of the clock signal CLK and the monitoring clock signal CLK_M. In detail, the clock monitoring circuit 10 may detect the frequency variation of each of the clock signal CLK and the monitoring clock signal CLK_M by using the first upper limit voltage BH1, the first lower voltage BL1, the second upper limit voltage BH2, and the second lower limit voltage BL2 that are each used to detect the duty ratio variation of each of the clock signal CLK and the monitoring clock signal CLK_M, thereby detecting all of the duty ratio variation and the frequency variation of each of the clock signal CLK and the monitoring clock signal CLK_M. Therefore, the clock monitoring circuit 10 may detect a case where the duty ratio and the frequency of each of the clock signal CLK and the monitoring clock signal CLK_M are outside of a normal range (the normal range for example a range between a lower limit and an upper limit), and thus, may monitor the clock signal CLK and the monitoring clock signal CLK_M.

Figure 2:
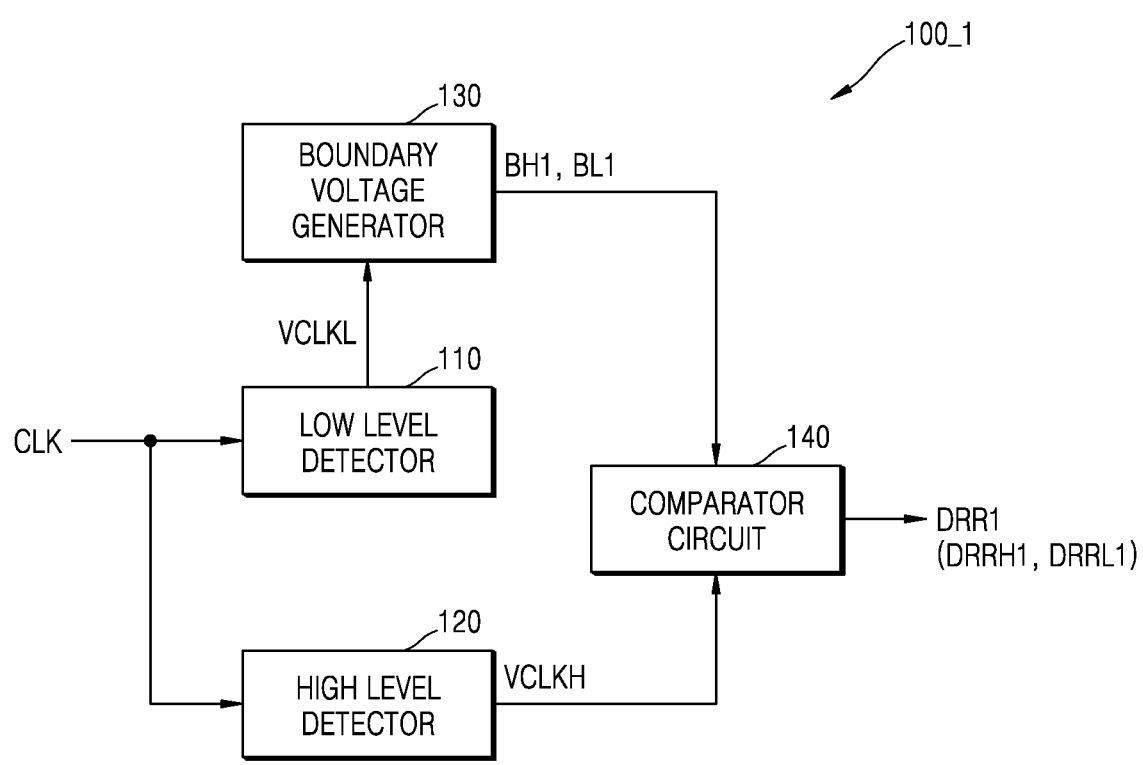
FIG. 2 illustrates a block diagram of a first duty ratio detector included in a clock monitoring circuit according to an example embodiment of the inventive concepts.

FIG. 2 illustrates a block diagram of a first duty ratio detector 100_1 included in the clock monitoring circuit 10 according to an example embodiment of the inventive concepts.

Referring to FIG. 2, the first duty ratio detector 100_1 may include a low level detector 110, a high level detector 120, a boundary voltage generator 130, and a comparator circuit 140. The second duty ratio detector 100_2 of FIG. 1, like the first duty ratio detector 100_1 of FIG. 2, may include a low level detector, a high level detector, a boundary voltage generator, and a comparator circuit. The following description of the elements of the first duty ratio detector 100_1 may be applied to the elements of the second duty ratio detector 100_2.

The low level detector 110 may receive a clock signal CLK, and may generate and output an off-duty width voltage VCLKL corresponding to a length of a low level period (an off-time period) of the clock signal CLK. For example, the low level detector 110 may generate the off-duty width voltage VCLKL so that a level of the off-duty width voltage VCLKL increases as the low level period increases.

The high level detector 120 may receive the clock signal CLK, and may generate and output an on-duty width voltage VCLKH corresponding to a length of a high level period (an on-time period) of the clock signal CLK. For example, the high level detector 120 may generate the on-duty width voltage VCLKH so that a level of the on-duty width voltage VCLKH increases as the high level period increases.

The boundary voltage generator 130 may receive the off-duty width voltage VCLKL from the low level detector 110, and may generate a first upper limit voltage BH1 and a first lower limit voltage BL1. In this case, the first upper limit voltage BH1 may have a level as high as the first upper limit level with respect to the off-duty width voltage VCLKL, and the first lower limit voltage BL1 may have a level as low as the first lower limit level with respect to the off-duty width voltage VCLKL. In an example embodiment, the first upper limit level and the first lower limit level may have the same value.

The comparator circuit 140 may receive the on-duty width voltage VCLKH from the high level detector 120 and may receive the first upper limit voltage BH1 and the first lower limit voltage BL1 from the boundary voltage generator 130. The comparator circuit 140 may compare the on-duty width voltage VCLKH with the first upper limit voltage BH1 and may compare the on-duty width voltage VCLKH with the first lower limit voltage BL1, thereby generating a first duty ratio signal DRR1.

In an example embodiment, the first duty ratio signal DRR1 may include a first signal DRRH1 and a second signal DRRL1. For example, when the on-duty width voltage VCLKH is higher than the first upper limit voltage BH1, the comparator circuit 140 may output the first signal DRRH1 having a first logic level (for example, a high level), and when the on-duty width voltage VCLKH is equal to or lower than the first upper limit voltage BH1, the comparator circuit 140 may output the first signal DRRH1 having a second logic level (for example, a low level). Also, when the on-duty width voltage VCLKH is lower than the first lower limit voltage BL1, the comparator circuit 140 may output the second signal DRRL1 having the first logic level, and when the on-duty width voltage VCLKH is equal to or higher than the first lower limit voltage BL1, the comparator circuit 140 may output the second signal DRRL1 having the second logic level.

Figure 3:
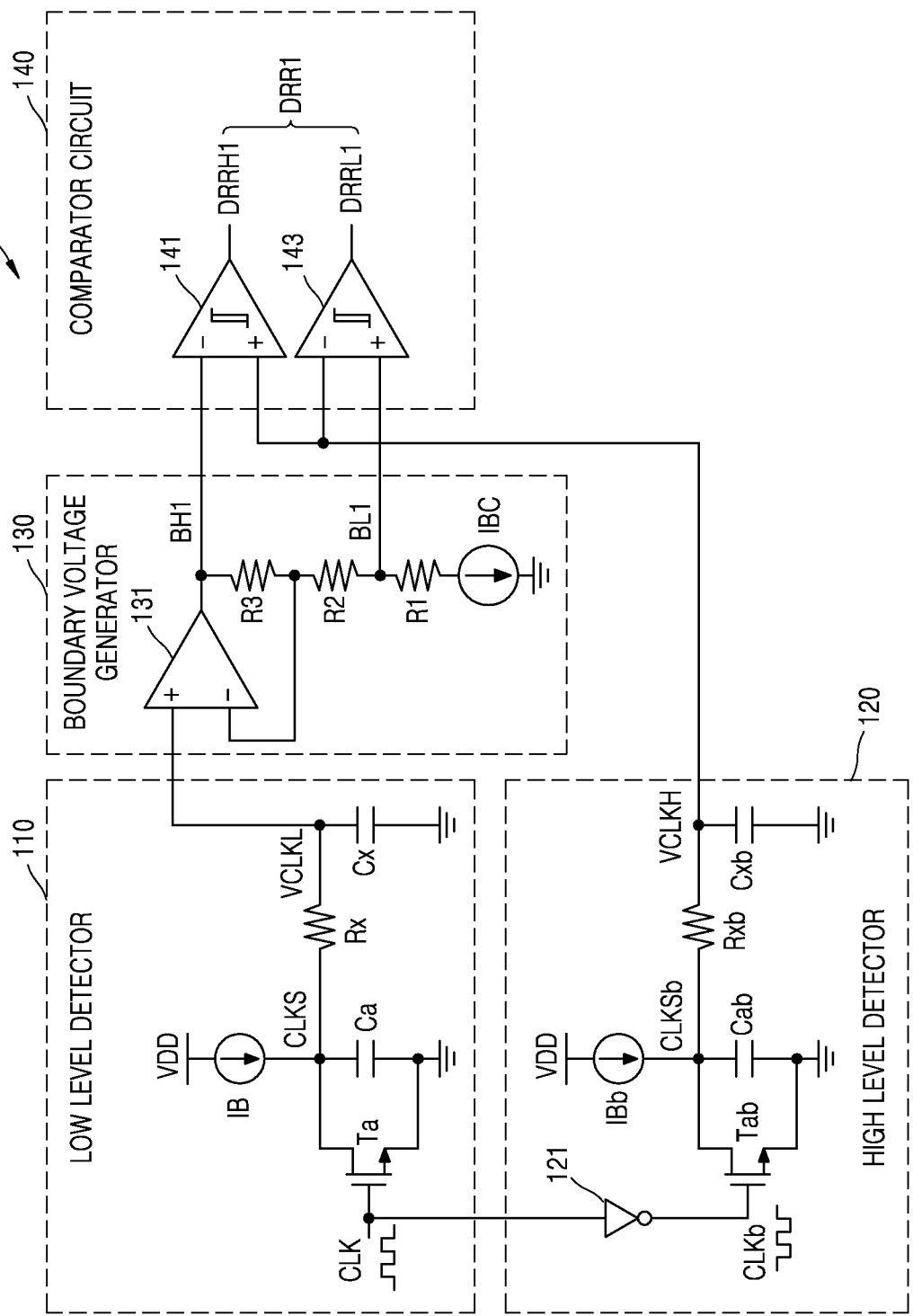
FIG. 3 illustrates a circuit diagram of a first duty ratio detector included in a clock monitoring circuit according to an example embodiment of the inventive concepts.

FIG. 3 illustrates a circuit diagram of a first duty ratio detector 100_1 included in the clock monitoring circuit 10 according to an example embodiment, and is a circuit diagram according to the example embodiment illustrated in FIG. 2.

Referring to FIG. 3, the first duty ratio detector 100_1 may include a low level detector 110, a high level detector 120, a boundary voltage generator 130, and a comparator circuit 140. The second duty ratio detector 100_2 of FIG. 1 may include a low level detector, a high level detector, a boundary voltage generator, and a comparator circuit, and the following description of the elements of the first duty ratio detector 100_1 may be applied to the elements of the second duty ratio detector 100_2.

The low level detector 110 may include a transistor Ta which is turned on based on a clock signal CLK, a capacitor Ca which is charged or discharged based on the clock signal CLK, and a low pass filter including a resistor Rx and a capacitor Cx. The capacitor Ca may be connected to a current source IB, and the current source IB may be connected to a source voltage VDD.

In a low level period of the clock signal CLK, the transistor Ta may be turned off, and the capacitor Ca may be charged by the current source IB. A voltage CLKS of the capacitor Ca may progressively increase in the low level period of the clock signal CLK. On the other hand, in a high level period of the clock signal CLK, the transistor Ta may be turned on, and the voltage CLKS of the capacitor Ca may be 0 V. Therefore, the voltage CLKS of the capacitor Ca may be a sawtooth wave having the same period as that of the clock signal CLK. As the low level period of the clock signal CLK increases, a charging time of the capacitor Ca may increase, and thus, a maximum value of the voltage CLKS of the capacitor Ca may increase.

The low pass filter including the resistor Rx and the capacitor Cx may receive the voltage CLKS of the capacitor Ca and may output, as the off-duty width voltage VCLKL, an average value of the voltage CLKS of the capacitor Ca during a period of the clock signal CLK. The off-duty width voltage VCLKL of the clock signal CLK may satisfy the following Equation (1).

$$VCLKL \propto \frac{IB \cdot TS \cdot DL^2}{Ca} \qquad \text{[Equation 1]}$$

Here, IB denotes a level of a current of the current source IB connected to the capacitor Ca, TS denotes the period of the clock signal CLK, DL denotes a ratio of the low level period (an off-time period) to the period TS of the clock signal CLK, and Ca denotes a capacitance of the capacitor Ca. Therefore, as the low level period increases, a level of the off-duty width voltage VCLKL may increase.

The high level detector 120 may include an inverter 121 which inverts the clock signal CLK, a transistor Tab which is turned on based on a clock inversion signal CLKb, a capacitor Cab which is charged or discharged based on the clock inversion signal CLKb, and a low pass filter including a resistor Rxb and a capacitor Cxb. The capacitor Cab may be connected to the current source IBb, and the current source IBb may be connected to the source voltage VDD.

In a low level period of the clock inversion signal CLKb (i.e., the high level period of the clock signal CLK), the transistor Tab may be turned off, and the capacitor Cab may be charged by the current source IBb. A voltage CLKSb of the capacitor Cab may progressively increase in the high level period of the clock signal CLK.

On the other hand, in a high level period of the clock inversion signal CLKb (i.e., the low level period of the clock signal CLK), the transistor Tab may be turned on, and the voltage CLKSb of the capacitor Cab may be 0 V. Therefore, the voltage CLKSb of the capacitor Cab may be a sawtooth wave having the same period as that of the clock signal CLK, and as the high level period of the clock signal CLK increases, a maximum value of the voltage CLKSb of the capacitor Cab may increase.

The low pass filter including the resistor Rxb and the capacitor Cxb may receive the voltage CLKSb of the capacitor Cab and may output, as the on-duty width voltage VCLKH, an average value of the voltage CLKSb of the capacitor Cab during a period of the clock signal CLKb. The on-duty width voltage VCLKH may satisfy the following Equation (2).

$$VCLKH \propto \frac{IBb \cdot TS \cdot DH^2}{Cab} \qquad \text{[Equation 2]}$$

Here, IBb denotes a level of a current of the current source IBb connected to the capacitor Cab, TS denotes the period of the clock signal CLK, DH denotes a ratio (i.e., a duty ratio) of the high level period (an on-time period) to the period TS of the clock signal CLK, and Cab denotes a capacitance of the capacitor Cab. Therefore, as the high level period of the clock signal CLK increases, a level of the on-duty width voltage VCLKH may increase.

In an example embodiment, the elements of the high level detector 120 other than the inverter 121 may be the same as the elements of the low level detector 110, and may have the same characteristics as those of the low level detector 110. That is, it may be configured that a size of the transistor Tab of the high level detector 120 is the same as that of a transistor Ta of the low level detector 110, a capacitance of the capacitor Cab of the high level detector 120 is the same as that of a capacitor Ca of the low level detector 110, and a level of a current of the current source IBb of the high level detector 120 is the same as that of a current of the current source IB of the low level detector 110. Also, in an example embodiment, the low pass filter of the high level detector 120 may be configured to have the same characteristic as that of the low pass filter of the low level detector 110.

The boundary voltage generator 130 may include an operational amplifier 131, a plurality of resistors R1, R2 and R3, and a current source IBC. The first upper limit voltage BH1 and the first lower limit voltage BL1 may satisfy the following Equation (3).

$$BH1 = VCLKL + IBC \cdot R3$$

$$BL1 = VCLKL - IBC \cdot R2 \qquad \text{[Equation 3]}$$

Here, IBC denotes a level of a current of the current source IBC, and R2 and R3 denote resistance values of the resistors R2 and R3. When the resistance values of the resistors R2 and R3 are the same, each of the first upper limit voltage BH1 and the first lower limit voltage BL1 may have a difference equal to the same level with respect to the off-duty width voltage VCLKL. That is, a first upper limit level and a first lower limit level may be the same. By adjusting the resistance values R2 and R3 of the boundary voltage generator 130, a level of each of the first upper limit voltage BH1 and the first lower limit voltage BL1 may be adjusted, and an upper limit and a lower limit of the duty ratio of the clock signal CLK may be set.

The comparator circuit 140 may include a first comparator 141 and a second comparator 143. The first comparator 141 may receive the on-duty width voltage VCLKH from the high level detector 120 and may receive the first upper limit voltage BH1 from the boundary voltage generator 130. The first comparator 141 may output a comparison result, obtained by comparing the on-duty width voltage VCLKH with the first upper limit voltage BH1, as a first signal DRRH1. For example, when the on-duty width voltage VCLKH is higher than the first upper limit voltage BH1, the first comparator 141 may output the first signal DRRH1 having the first logic level (for example, a high level), and when the on-duty width voltage VCLKH is lower than the first upper limit voltage BH1, the first comparator 141 may output the first signal DRRH1 having the second logic level (for example, a low level).

The second comparator 143 may receive the on-duty width voltage VCLKH from the high level detector 120 and may receive the first lower limit voltage BL1 from the boundary voltage generator 130. The second comparator 143 may output a comparison result, obtained by comparing the on-duty width voltage VCLKH with the first lower limit voltage BL1, as a second signal DRRL1. For example, when the on-duty width voltage VCLKH is higher than the first lower limit voltage BL1, the second comparator 143 may output the second signal DRRL1 having the second logic level, and when the on-duty width voltage VCLKH is lower than the first lower limit voltage BL1, the second comparator 143 may output the second signal DRRL1 having the first logic level.

The first comparator 141 and the second comparator 143 may be configured to use a time hysteresis or a voltage hysteresis in a comparison operation. For example, instead of outputting the first signal DRRH1 at the first logic level just as soon as the on-duty width voltage VCLKH becomes higher than the first upper limit voltage BH1, the first comparator 141 may output the first signal DRRH1 having the first logic level when the on-duty width voltage VCLKH is higher than the first upper limit voltage BH1 for a predetermined duration. Instead of outputting the second signal DRRL1 at the first logic level just as soon as the on-duty width voltage VCLKH becomes lower than the first lower limit voltage BL1, the second comparator 143 may output the second signal DRRL1 having the first logic level when the on-duty width voltage VCLKH is lower than the first lower limit voltage BL1 for a predetermined duration.

In FIG. 3, a circuit configuration of the first duty ratio detector 100_1 according to an example embodiment is illustrated. However, the clock monitoring circuit 10 according to the inventive concepts is not limited thereto, and the first duty ratio detector 100_1 may be implemented to various circuit configurations.

The first duty ratio detector 100_1 according to the inventive concepts may detect a duty ratio variation of the clock signal CLK by using the off-duty width voltage VCLKL and the on-duty width voltage VCLKH that each pass through respective low pass filters, and thus may decrease power consumption compared to a case which detects the duty ratio variation of the clock signal CLK by using a maximum value of the voltage CLKS of the capacitor Ca of the low level detector 110 or a maximum value of the voltage CLKSb of the capacitor Cab of the high level detector 120. That is, in the first duty ratio detector 100_1, since an average voltage of the voltage CLKS of the capacitor Ca of the low level detector 110 is used, the use of a high-speed comparator may not be needed and power consumption may be reduced in a process where the clock monitoring circuit 10 detects a variation of a duty ratio, and thus, the clock monitoring circuit 10 may be applied to a low power system.

Figure 4A:
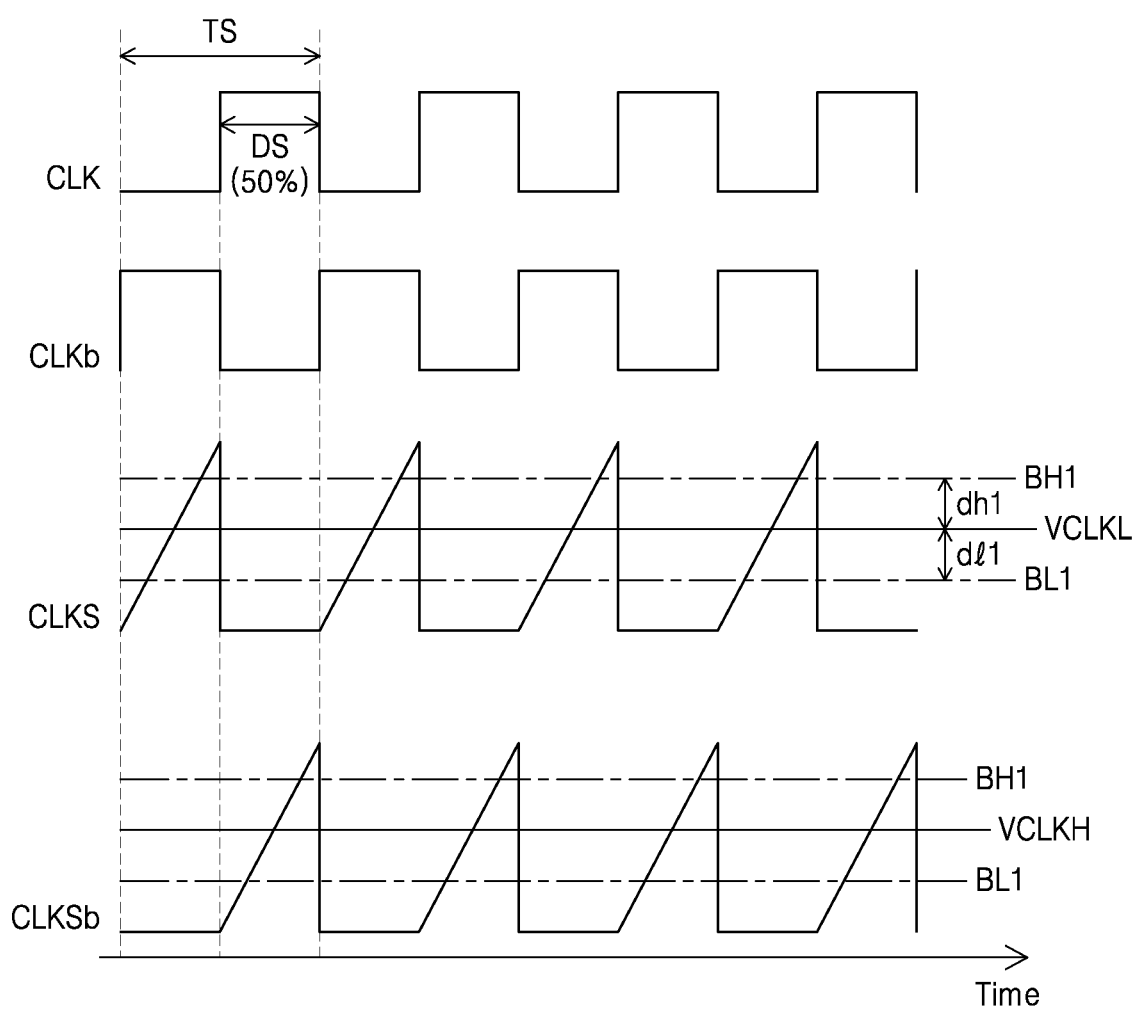
FIGS. 4A, 4B and 4C illustrate timing diagrams descriptive of an operation of a first duty ratio detector included in a clock monitoring circuit according to an example embodiment of the inventive concepts.
Figure 4B:
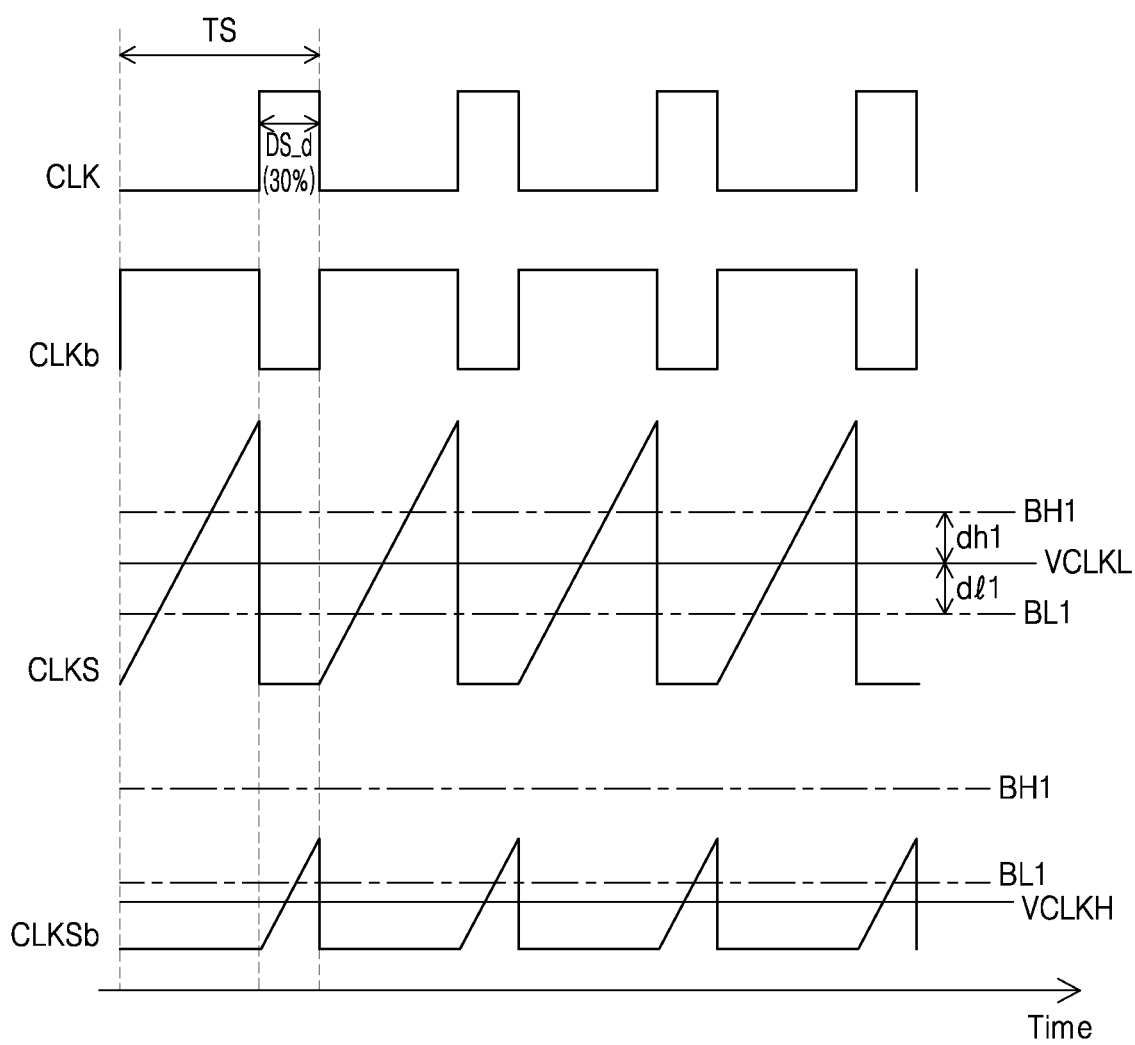
Figure 4C:
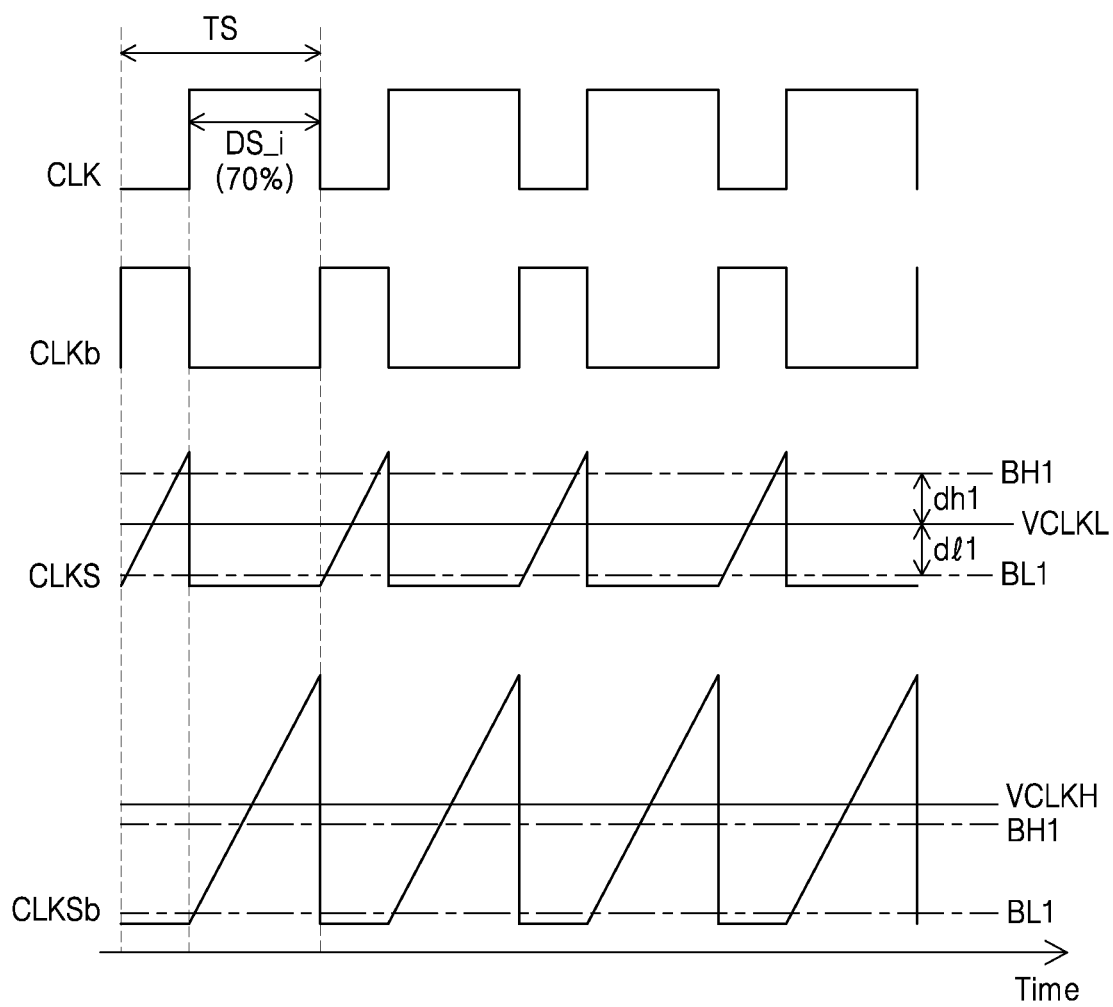

FIGS. 4A, 4B and 4C illustrate timing diagrams descriptive of an operation of the first duty ratio detector 100_1 included in the clock monitoring circuit 10 according to an example embodiment of the inventive concepts. In FIGS. 4A to 4C, an operation of the first duty ratio detector 100_1 will be described, but the same description may be applied to an operation of the second duty ratio detector 100_2 of FIG. 1. In FIGS. 4A to 4C, for convenience of description, it may be assumed that the elements of the high level detector 120 other than the inverter 121 have the same characteristics as that of the low level detector 110, but the inventive concepts are not limited thereto.

Referring to FIGS. 3 and 4A, the clock signal CLK may have a certain period TS and may have a duty ratio of 50%. A length of a high level period DS of the clock signal CLK may be the same as that of a low level period of the clock signal CLK.

The voltage CLKS of the capacitor Ca of the low level detector 110 and the voltage CLKSb of the capacitor Cab of the high level detector 120 may each be a sawtooth wave having the same period TS as that of the clock signal CLK. The voltage CLKS of the capacitor Ca of the low level detector 110 may be a sawtooth wave where the sawtooths are formed in the low level periods of the clock signal CLK. On the other hand, the voltage CLKSb of the capacitor Cab of the high level detector 120 may be a sawtooth wave where the sawtooths are formed in the high level periods of the clock signal CLK.

The first upper limit voltage BH1 may have a level which is a first upper limit level dh1 higher than the off-duty width voltage VCLKL, and the first lower limit voltage BL1 may have a level which is a first lower limit level dl1 lower than the off-duty width voltage VCLKL. In an example embodiment, the first upper limit level dh1 and the first lower limit level dl1 may have the same value.

The elements of the high level detector 120 other than the inverter 121 may have the same characteristic as that of the low level detector 110, and thus, the off-duty width voltage VCLKL and the on-duty width voltage VCLKH may have substantially the same value. Therefore, the on-duty width voltage VCLKH may have a value between the first upper limit voltage BH1 and the first lower limit voltage BL1.

The comparator circuit 140 may output the first duty detection signal DRR1 which includes the first signal DRRH1 having the second logic level (for example, a low level) and the second signal DRRL1 having the second logic level.

Referring to FIGS. 3 and 4B, the clock signal CLK may have a certain period TS and may have a reduced duty ratio (for example, a duty ratio of 30%). Therefore, a length of a high level period DS_d of the clock signal CLK may be shorter than that of a low level period of the clock signal CLK.

The voltage CLKS of the capacitor Ca of the low level detector 110 may be a sawtooth wave where the sawtooths are formed in the low level periods of the clock signal CLK. On the other hand, the voltage CLKSb of the capacitor Cab of the high level detector 120 may be a sawtooth wave where the sawtooths are formed in the high level periods of the clock signal CLK. Since a length of a high level period DS_d of the clock signal CLK is shorter than that of the low level period of the clock signal CLK, a maximum value of the voltage CLKS of the capacitor Ca of the low level detector 110 may be greater than that of the voltage CLKSb of the capacitor Cab of the high level detector 120.

As compared with the off-duty width voltage VCLKL of FIG. 4A, the off-duty width voltage VCLKL of FIG. 4B may be increased, and simultaneously, the first upper limit voltage BH1 and the first lower limit voltage BL1 may be increased. On the other hand, as compared with the on-duty width voltage VCLKH of FIG. 4A, the on-duty width voltage VCLKH of FIG. 4B may be decreased and may have a value which is less than the first lower limit voltage BL1. The comparator circuit 140 may output the first duty detection signal DRR1 which includes the first signal DRRH1 having the second logic level (for example, a low level) and the second signal DRRL1 having the first logic level (for example, a high level).

Referring to FIGS. 3 and 4C, the clock signal CLK may have a certain period TS and may have an increased duty ratio (for example, a duty ratio of 70%). Therefore, a length of a high level period DS_i of the clock signal CLK may be longer than that of a low level period of the clock signal CLK.

The voltage CLKS of the capacitor Ca of the low level detector 110 may be a sawtooth wave where the sawtooths are formed in the low level periods of the clock signal CLK. On the other hand, the voltage CLKSb of the capacitor Cab of the high level detector 120 may be a sawtooth wave where the sawtooths are formed in the high level period of the clock signal CLK. Since a length of a high level period DS_i of the clock signal CLK is longer than that of the low level period of the clock signal CLK, a maximum value of the voltage CLKS of the capacitor Ca of the low level detector 110 may be less than that of the voltage CLKSb of the capacitor Cab of the high level detector 120.

As compared with the off-duty width voltage VCLKL of FIG. 4A, the off-duty width voltage VCLKL of FIG. 4C may be decreased, and simultaneously, the first upper limit voltage BH1 and the first lower limit voltage BL1 may be decreased. On the other hand, as compared with the on-duty width voltage VCLKH of FIG. 4A, the on-duty width voltage VCLKH of FIG. 4C may be increased and may have a value which is greater than the first upper limit voltage BH1. The comparator circuit 140 may output the first duty detection signal DRR1 which includes the first signal DRRH1 having the first logic level and the second signal DRRL1 having the second logic level.

Referring to FIGS. 4A to 4C, the first duty-ratio detector 100_1 may detect a case where the clock signal CLK does not maintain a duty ratio of 50%, and thus increases to be greater than an upper limit or decreases to be less than a lower limit. When a difference of the duty ratio of the clock signal CLK with respect to 50% increases, a probability that a portion of the clock signal CLK is not transferred may increase. The clock monitoring circuit 10 according to the inventive concepts may perform monitoring in order for the duty ratio of the clock signal CLK to be maintained at 50%, thereby enhancing the operation performance of an integrated circuit of the clock monitoring circuit 10.

Figure 5:
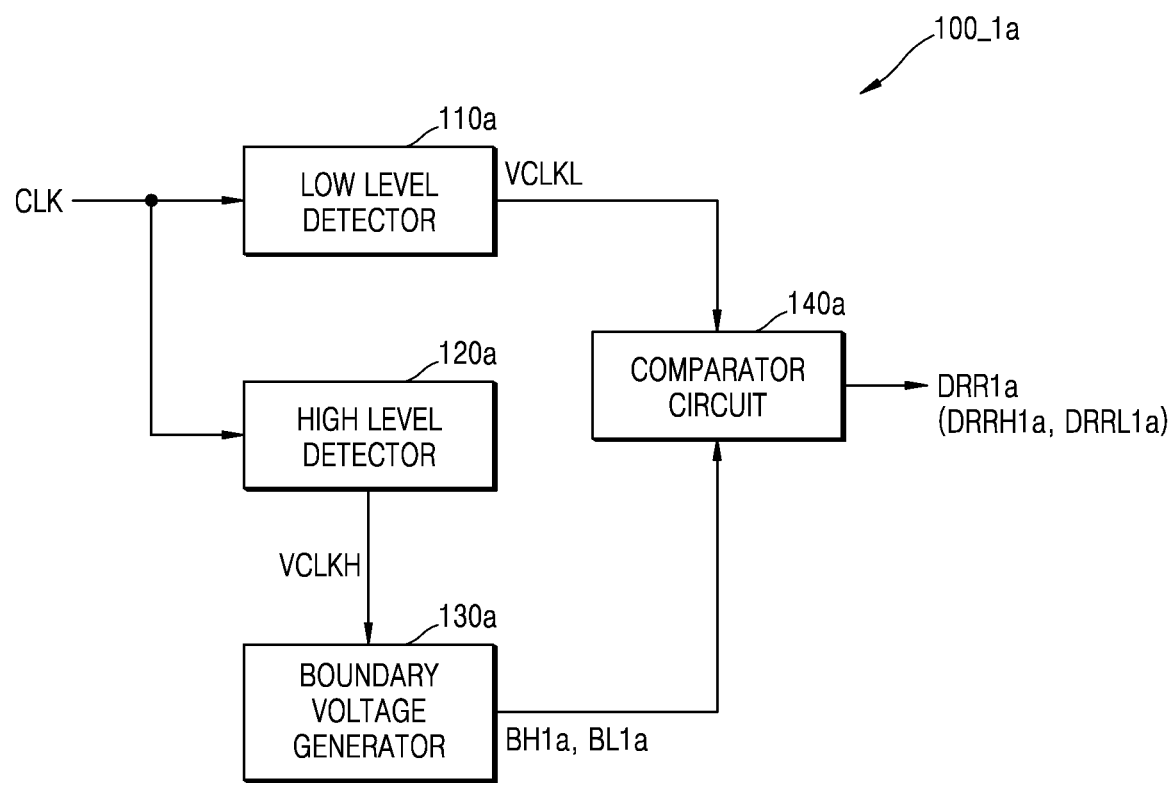
FIG. 5 illustrates a block diagram of a first duty ratio detector included in a clock monitoring circuit according to an example embodiment of the inventive concepts.

FIG. 5 illustrates a block diagram of a first duty ratio detector 100_1a included in the clock monitoring circuit 10 of FIG. 1 according to an example embodiment of the inventive concepts.

Referring to FIG. 5, the first duty ratio detector 100_1a may include a low level detector 110a, a high level detector 120a, a boundary voltage generator 130a, and a comparator circuit 140a. The second duty ratio detector 100_2 of FIG. 1 may also include a low level detector, a high level detector, a boundary voltage generator, and a comparator circuit such as shown in FIG. 5, and description of the elements of the first duty ratio detector 100_1a may be applied to the elements of the second duty ratio detector 100_2. The low level detector 110a of the first duty-ratio detector 100_1a may be implemented such as a circuit of the low level detector 110 of the first duty-ratio detector 100_1 illustrated in FIG. 3, and the high level detector 120a may be implemented such as a circuit of the high level detector 120 illustrated in FIG. 3.

The low level detector 110a may receive a clock signal CLK, and may generate and output an off-duty width voltage VCLKL corresponding to a length of a low level period of the clock signal CLK. For example, the low level detector 110a may generate the off-duty width voltage VCLKL so that a level of the off-duty width voltage VCLKL increases as the low level period increases.

The high level detector 120a may receive the clock signal CLK, and may generate and output an on-duty width voltage VCLKH corresponding to a length of a high level period of the clock signal CLK. For example, the high level detector 120a may generate the on-duty width voltage VCLKH so that a level of the on-duty width voltage VCLKH increases as the high level period increases.

The boundary voltage generator 130a may receive the on-duty width voltage VCLKH from the high level detector 120a, and may generate a first upper limit voltage BH1a and a first lower limit voltage BL1a. In this case, the first upper limit voltage BH1a may have a level as high as a first upper limit level from the on-duty width voltage VCLKH, and the first lower limit voltage BL1a may have a level as low as a first lower limit level with respect to the on-duty width voltage VCLKH. In an example embodiment, the first upper limit level and the first lower limit level may have the same value.

The comparator circuit 140a may receive the off-duty width voltage VCLKL from the low level detector 110a and may receive the first upper limit voltage BH1a and the first lower limit voltage BL1a from the boundary voltage generator 130a. The comparator circuit 140a may compare the off-duty width voltage VCLKL with the first upper limit voltage BH1a and may compare the off-duty width voltage VCLKL with the first lower limit voltage BL1a, thereby generating a first duty ratio signal DRR1a.

In an example embodiment, the first duty ratio signal DRR1a may include a first signal DRRH1a and a second signal DRRL1a. For example, when the off-duty width voltage VCLKL increases as a length of a low level period of the clock signal CLK increases and the off-duty width voltage VCLKL is higher than the first upper limit voltage BH1a, the comparator circuit 140a may output the second signal DRRL1a having the first logic level (for example, a high level). On the other hand, when the off-duty width voltage VCLKL is equal to or lower than the first upper limit voltage BH1a, the comparator circuit 140a may output the second signal DRRL1a having the second logic level (for example, a low level).

When the off-duty width voltage VCLKL decreases as a length of the low level period of the clock signal CLK decreases and the off-duty width voltage VCLKL is lower than the first lower limit voltage BL1a, the comparator circuit 140a may output the first signal DRRH1a having the first logic level. On the other hand, when the off-duty width voltage VCLKL is equal to or higher than the first lower limit voltage BL1a, the comparator circuit 140a may output the first signal DRRH1a having the second logic level.

Figure 6:
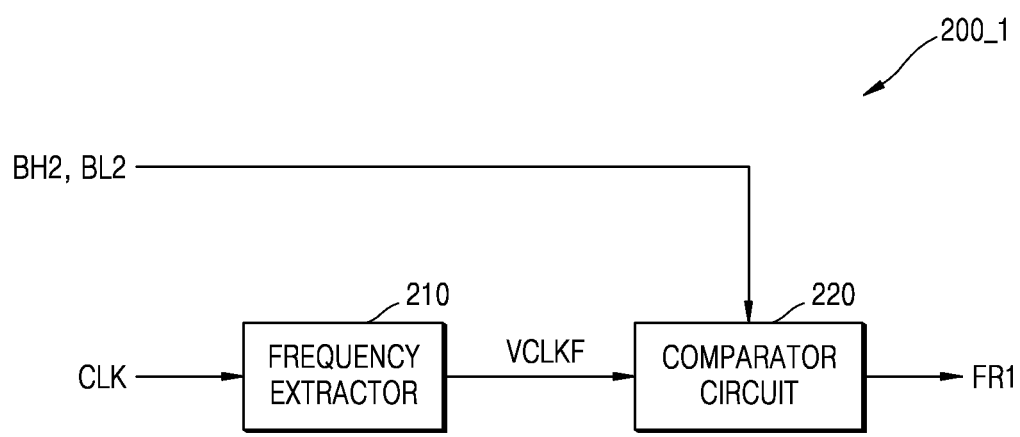
FIG. 6 illustrates a block diagram of a first frequency detector included in a clock monitoring circuit according to an example embodiment of the inventive concepts.

FIG. 6 illustrates a block diagram of a first frequency detector 200_1 included in the clock monitoring circuit 10 according to an example embodiment of the inventive concepts.

Referring to FIG. 6, the first frequency detector 200_1 may include a frequency extractor 210 and a comparator circuit 220. The second frequency detector 200_2 of FIG. 1 may include a frequency extractor and a comparator circuit, and the following description of the elements of the first frequency detector 200_1 may be applied to the elements of the second frequency detector 200_2.

The frequency detector 210 may receive a clock signal CLK, and may generate a frequency detection voltage VCLKF corresponding to a frequency of the clock signal CLK. In an example embodiment, the frequency extractor 210 may generate the frequency detection voltage VCLKF so that a level of the frequency detection voltage VCLKF increases as the frequency of the clock signal CLK decreases, namely, as a period of the clock signal CLK increases. Alternatively, in an example embodiment, the frequency extractor 210 may generate the frequency detection voltage VCLKF so that a level of the frequency detection voltage VCLKF increases as the frequency of the clock signal CLK increases.

The comparator circuit 220 may receive a second upper limit voltage BH2 and a second lower limit voltage BL2 from a second duty ratio detector (for example, 100_2 of FIG. 1). The second upper limit voltage BH2 and the second lower limit voltage BL2 may each be a voltage which is generated for detecting a duty ratio variation of a monitoring clock signal (for example, CLK_M of FIG. 1).

In an example embodiment, the second upper limit voltage BH2 may have a level as high as a second upper limit level with respect to a voltage (for example, an off-duty width voltage corresponding to a length of a low level period or an on-duty width voltage corresponding to a length of a high level period) corresponding to a duty ratio of a monitoring clock signal (for example, CLK_M of FIG. 1), and the second lower limit voltage BL2 may have a level as low as a second lower limit level with respect to a voltage corresponding to the duty ratio of the monitoring clock signal CLK_M. The second upper limit voltage BH2 and the second lower limit voltage BL2 may each be a boundary value which is used for the second duty ratio detector 100_2 to detect a duty ratio variation of the monitoring clock signal CLK_M.

The comparator circuit 220 may compare the frequency detection voltage VCLKF with the second upper limit voltage BH2, and may compare the frequency detection voltage VCLKF with the second lower limit voltage BL2, thereby generating a first frequency detection signal FR1. In an example embodiment, when the frequency detection voltage VCLKF has a level between the second upper limit voltage BH2 and the second lower limit voltage BL2, the comparator circuit 220 may output the first frequency detection signal FR1 having the first logic level (for example, a high level). Also, when the frequency detection voltage VCLKF is higher than the second upper limit voltage BH2 or less than the second lower limit voltage BL2, the comparator circuit 220 may output the first frequency detection signal FR1 having the second logic level (for example, a low level).

Figure 7:
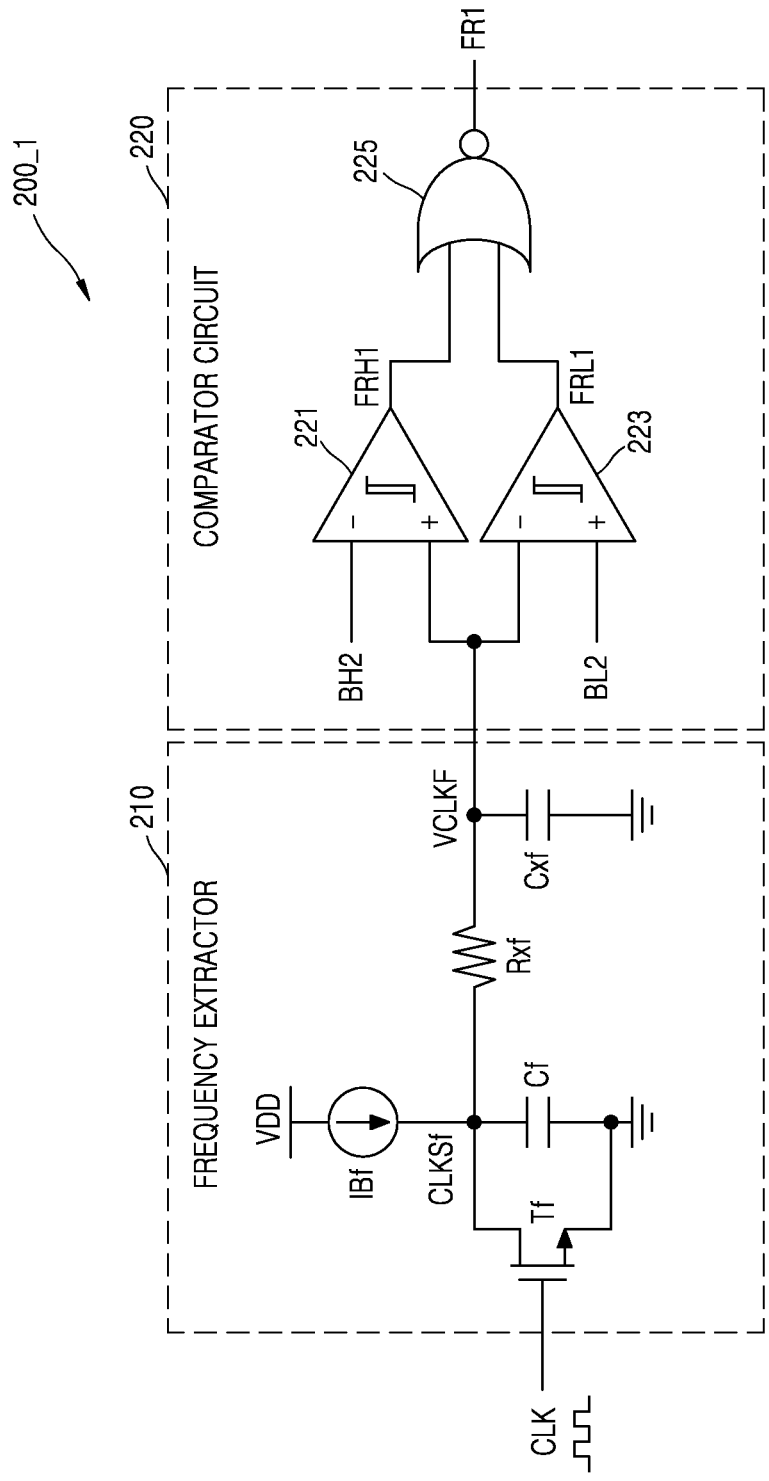
FIG. 7 illustrates a circuit diagram of a first frequency detector included in a clock monitoring circuit according to an example embodiment of the inventive concepts.

FIG. 7 illustrates a circuit diagram of a first frequency detector 200_1 included in the clock monitoring circuit 10 according to an example embodiment, and is a circuit diagram according to the example embodiment illustrated in FIG. 6.

Referring to FIG. 7, the first frequency detector 200_1 may include a frequency extractor 210 and a comparator circuit 220. The second frequency detector 200_2 of FIG. 1 may include a frequency extractor and a comparator circuit, and the following description of circuit elements of the first frequency detector 200_1 may be applied to the circuit elements of the second frequency detector 200_2.

The low level detector 110 may include a transistor Tf which is turned on based on a clock signal CLK, a capacitor Cf which is charged or discharged based on the clock signal CLK, and a low pass filter including a resistor Rxf and a capacitor Cxf. The capacitor Cf may be connected to a current source IBf, and the current source IBf may be connected to a source voltage VDD.

During a low level period of the clock signal CLK, the transistor Tf may be turned off, and the capacitor Cf may be charged by the current source IBf. A voltage CLKSf of the capacitor Cf may progressively increase during the low level period of the clock signal CLK. On the other hand, during a high level period of the clock signal CLK, the transistor Tf may be turned on, and the voltage CLKSf of the capacitor Cf may be 0 V. The voltage CLKSf of the capacitor Cf may be a sawtooth wave having the same period as that of the clock signal CLK, and as the low level period of the clock signal CLK increases, a maximum value of the voltage CLKSf of the capacitor Cf may increase.

The low pass filter including the resistor Rxf and the capacitor Cxf may receive the voltage CLKSf of the capacitor Cf and may output, as a frequency detection voltage VCLKF, an average value of the voltage CLKSf of the capacitor Cf during a period of the clock signal CLK. The frequency detection voltage VCLKF may satisfy the following Equation (4).

$$VCLKF \propto \frac{IBf \cdot TS \cdot DL^2}{Cf} \quad \text{[Equation 4]}$$

Here, IBf denotes a level of a current of the current source IBf connected to the capacitor Cf, TS denotes the period of the clock signal CLK, DL denotes a ratio of the low level period to the period TS of the clock signal CLK, and Cf denotes a capacitance of the capacitor Cf. Therefore, when a duty ratio of the frequency detection voltage VCLKF is constant, a level of the frequency detection voltage VCLKF may increase as the period TS of the clock signal CLK increases, namely, as a frequency of the clock signal CLK decreases.

In an example embodiment, the elements of the frequency extractor 210 may have the same characteristics as those of a low level detector (e.g., 110 of FIG. 3). That is, it may be configured that the transistor Tf of the frequency extractor 210 is the same as the transistor Ta of the low level detector 110, a capacitance of the capacitor Cf of the frequency extractor 210 is the same as that of the capacitor Ca of the low level detector 110, and a level of a current of the current source IBf of the frequency extractor 210 is the same as that of a current of the current source IB of the low level detector 110. Also, in an example embodiment, the low pass filter of the frequency extractor 210 may have the same characteristic as that of the low pass filter of the low level detector 110.

However, in a circuit configuration of the frequency extractor 210 of FIG. 7, it may be assumed that a second upper limit voltage BH2 and a second lower limit voltage BL2 each input to the comparator circuit 220 are provided from the second duty ratio detector 100_2 having a configuration illustrated in FIG. 2. In a case where the second upper limit voltage BH2 and the second lower limit voltage BL2 each input to the comparator circuit 220 are provided from the second duty ratio detector 100_2 having a configuration illustrated in FIG. 5, circuit elements of the frequency extractor 210 may have the same characteristics as those of elements of a high level detector (for example, 120 of FIG. 3). That is, the frequency extractor 210 may further include an inverter and may use a clock inversion signal CLKb.

The comparator circuit 220 may include a first comparator 221, a second comparator 223, and a NOR gate 225. However, the NOR gate 225 may be merely an example, and the comparator circuit 220 according to the inventive concepts may include an XOR gate instead of the NOR gate 225 and may be implemented as various circuits.

The first comparator 221 may receive a frequency detection voltage VCLKF from the frequency extractor 210 and may receive the second upper limit voltage BH2 from a second duty ratio detector (for example, 100_2 of FIG. 1). The first comparator 221 may compare the frequency detection voltage VCLKF with the second upper limit voltage BH2 and output a comparison result signal FRH1. For example, when the frequency detection voltage VCLKF is higher than the second upper limit voltage BH2, the first comparator 221 may output the comparison result signal FRH1 having the first logic level (for example, a high level), and when the frequency detection voltage VCLKF is equal to or lower than the second upper limit voltage BH2, the first comparator 221 may output the comparison result signal FRH1 having the second logic level (for example, a low level).

The second comparator 223 may receive the frequency detection voltage VCLKF from the frequency extractor 210 and may receive the second lower limit voltage BL2 from the second duty ratio detector 100_2. The second comparator 223 may compare the frequency detection voltage VCLKF with the second lower limit voltage BL2 and output a comparison result signal FRL1. For example, when the frequency detection voltage VCLKF is equal to or higher than the second lower limit voltage BL2, the second comparator 223 may output the comparison result signal FRL1 having the second logic level, and when the frequency detection voltage VCLKF is lower than the second lower limit voltage BL2, the second comparator 223 may output the comparison result signal FRL1 having the first logic level.

The NOR gate 225 may receive the comparison result signal FRH1 from the first comparator 221 and the comparison result signal FRL1 from the second comparator 223. When all of the comparison result signal FRH1 output from the first comparator 221 and the comparison result signal FRL1 output from the second comparator 223 have the second logic level, the NOR gate 225 may output a first frequency detection FR1 having the first logic level. Therefore, when the frequency detection voltage VCLKF has a level between the second upper limit voltage BH2 and the second lower limit voltage BL2, the first frequency detection signal FR1 having the first logic level may be output.

On the other hand, when one of the comparison result signal FRH1 output from the first comparator 221 and the comparison result signal FRL1 output from the second comparator 223 has the first logic level, the NOR gate 225 may output the first frequency detection FR1 having the second logic level. Therefore, when the frequency detection voltage VCLKF is higher than the second upper limit voltage BH2 or lower than the second lower limit voltage BL2, the first frequency detection signal FR1 having the second logic level may be output.

The first frequency detector 200_1 according to the inventive concepts may use the frequency detection voltage VCLKF having an average value of the voltage CLKSf of the capacitor Cf of the frequency extractor 210 by using the low pass filter, and thus, a comparator (for example, the first comparator 221 and the second comparator 223) having a relatively slow speed may be used. Therefore, a frequency extractor of a comparative example which uses a maximum value of the voltage CLKSf of the capacitor Cf for detecting a variation of a frequency needs a comparator having a relatively fast speed, but the first frequency detector 200_1 according to the inventive concepts may reduce the power consumption of the first frequency detector 200_1 by using a comparator having a relatively slow speed.

Figure 8A:
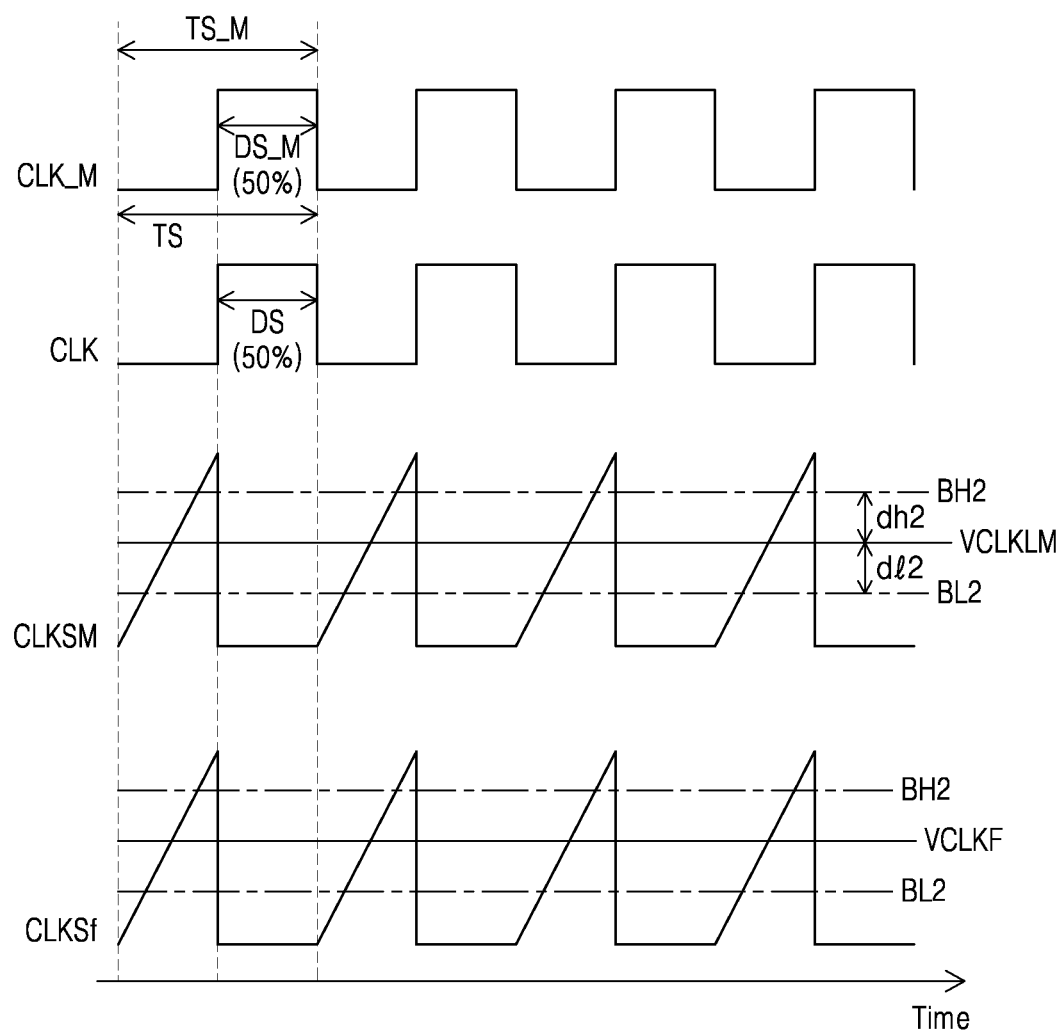
FIGS. 8A, 8B and 8C illustrate timing diagrams for describing an operation of a first frequency detector included in a clock monitoring circuit according to an example embodiment of the inventive concepts.
Figure 8B:
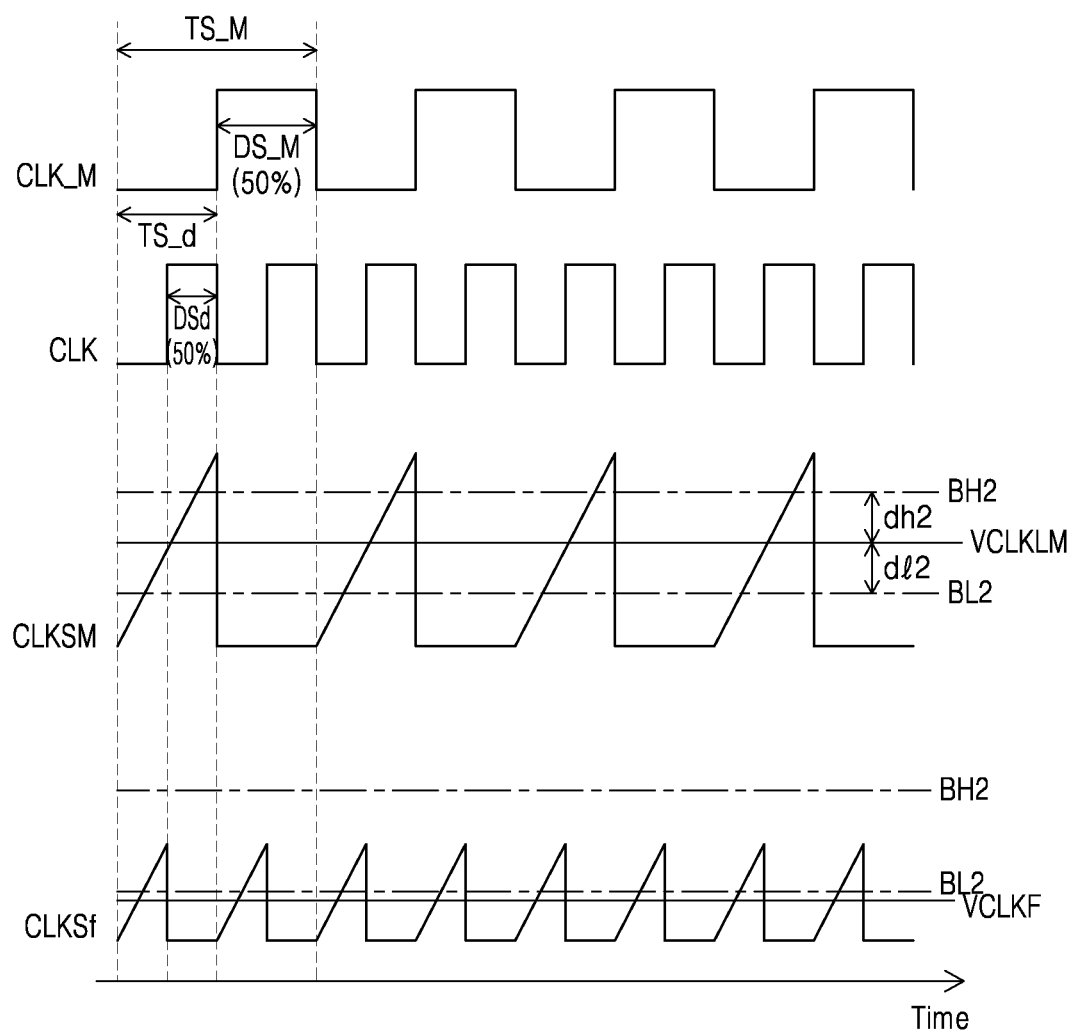
Figure 8C:
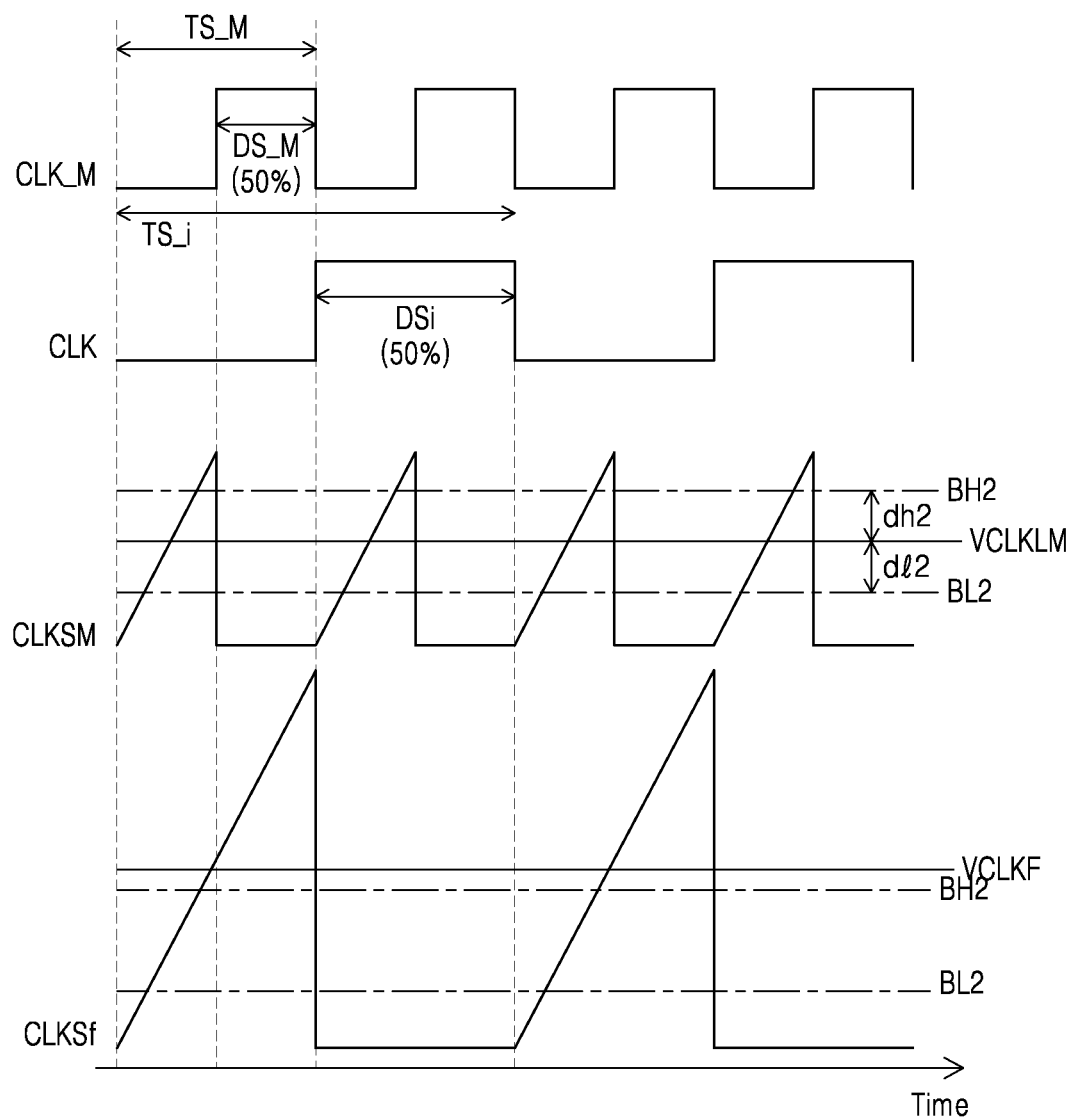

FIGS. 8A, 8B and 8C are timing diagrams descriptive of an operation of the first frequency detector 200_1 included in the clock monitoring circuit 10 according to an example embodiment of the inventive concepts.

In FIGS. 8A to 8C, an operation of the first frequency detector 200_1 will be described, but the same description may be applied to an operation of the second frequency detector 200_2 of FIG. 1. It may be assumed that the second duty ratio detector 100_2 of FIG. 1 is configured as the same circuit as that of the first duty ratio detector 100_1 illustrated in FIG. 3.

Referring to FIGS. 7 and 8A, a period TS_M of a monitoring clock signal CLK_M and a period TS of the clock signal CLK may be the same. Also, the monitoring clock signal CLK_M and the clock signal CLK may each have a duty ratio of 50%. Therefore, a length of each of high level periods DS_M and DS respectively of the monitoring clock signal CLK_M and the clock signal CLK may be the same as that of each of low level periods of the monitoring clock signal CLK_M and the clock signal CLK.

A voltage CLKSM of a capacitor included in a low level detector of the second duty ratio detector 100_2 may be charged or discharged according to control based on the monitoring clock signal CLK_M. For example, when the monitoring clock signal CLK_M has a low level, the capacitor may be charged, and when the monitoring clock signal CLK_M has a high level, the capacitor may be discharged.

The voltage CLKSM of the capacitor may be a sawtooth wave having the same period TS_M as that of the monitoring clock signal CLK_M, and sawtooths may be formed in the low level periods of the monitoring clock signal CLK_M. An off-duty monitoring voltage VCLKLM may be an average value of the voltage CLKSM of the capacitor during the period TS_M of the monitoring clock signal CLK_M.

A voltage CLKSf of the capacitor Cf of the frequency extractor 210 may be a sawtooth wave having the same period TS as that of the clock signal CLK. The voltage CLKSf of the capacitor Cf of the frequency extractor 210 may be a sawtooth wave where sawtooths are formed in the low level periods of the clock signal CLK.

When a low level detector of the second duty ratio detector 100_2 and the frequency extractor 210 are configured as the same circuit, the off-duty monitoring voltage VCLKLM and the frequency detection voltage VCLKF may be substantially the same. Therefore, the frequency detection voltage VCLKF may have a value between the second upper limit voltage BH2 and the second lower limit voltage BL2. In this case, the second upper limit voltage BH2 may have a level which is a second upper limit level dh2 higher than the off-duty monitoring voltage VCLKLM, and the second lower limit voltage BL2 may have a level which is a second lower limit level dl2 lower than the off-duty monitoring voltage VCLKLM. In an example embodiment, the second upper limit level dh2 and the second lower limit level dl2 may have the same value.

The comparator circuit 220 may output the first frequency detection signal FR1 having the first logic level (for example, a high level).

Referring to FIGS. 7 and 8B, a period TSd of the clock signal CLK may become shorter than a period TS_M of a monitoring clock signal CLK_M. That is, a frequency of the clock signal CLK may become higher than that of monitoring clock signal CLK_M. A length of a high level period DSd of the clock signal CLK may become shorter than that of a high level period DS of the clock signal CLK shown in FIG. 8A.

As the period TSd of the clock signal CLK is shortened, a maximum value of the voltage CLKSf of the capacitor Cf of the frequency extractor 210 may decrease, and a level of a frequency detection voltage VCLKF may decrease. Therefore, the frequency detection voltage VCLKF may become lower than the second lower limit voltage BL2, and the comparator circuit 220 may output the first frequency detection signal FR1 having the second logic level (for example, a low level).

Referring to FIGS. 7 and 8C, a period TS_i of the clock signal CLK may become longer than a period TS_M of a monitoring clock signal CLK_M. That is, a frequency of the clock signal CLK may become lower than that of monitoring clock signal CLK_M. A length of a high level period DSi of the clock signal CLK may become longer than that of the high level period DS of the clock signal CLK shown in FIG. 8A.

As the period TSi of the clock signal CLK increases, a maximum value of the voltage CLKSf of the capacitor Cf of the frequency extractor 210 may increase, and a level of a frequency detection voltage VCLKF may increase. Therefore, the frequency detection voltage VCLKF may become higher than the second upper limit voltage BH2, and the comparator circuit 220 may output the first frequency detection signal FR1 having the second logic level.

Referring to FIGS. 8A to 8C, a frequency of the clock signal CLK may be associated with various operation speeds of an integrated circuit including the clock monitoring circuit 10, and thus, the clock signal CLK may be generated to have a predetermined frequency in the integrated circuit. The first frequency detector 200_1 may detect a case where the frequency of the clock signal CLK increases or decreases excessively and may detect an abnormal state of each of the clock signal CLK and the monitoring clock signal CLK_M.

Figure 9:
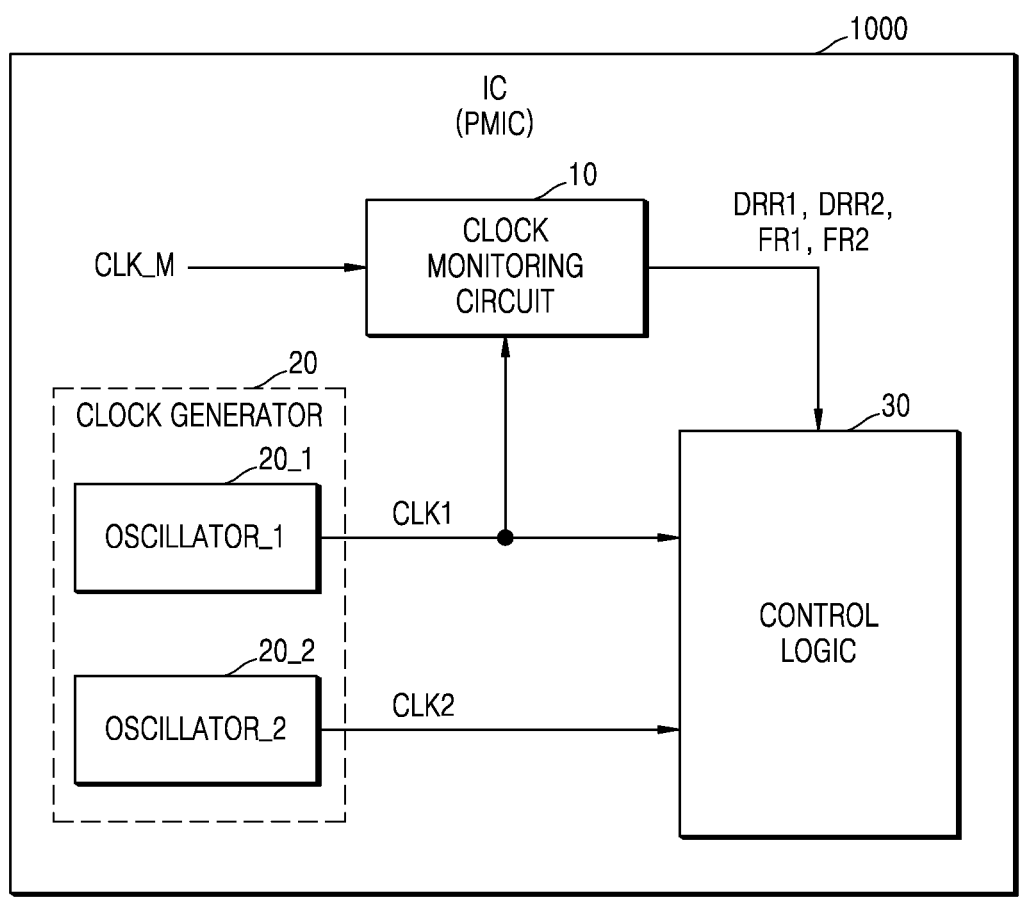
FIG. 9 illustrates a block diagram descriptive of an integrated circuit according to an example embodiment of the inventive concepts.

FIG. 9 illustrates a block diagram descriptive of an integrated circuit 1000 according to an example embodiment of the inventive concepts.

Referring to FIG. 9, the integrated circuit 1000 may include a clock monitoring circuit 10, a clock generator 20, and control logic 30. The clock generator 20 may generate clock signals CLK1 and CLK2. For example, the clock generator 20 may include a first oscillator 20_1 and a second oscillator 20_2.

In FIG. 9, it is illustrated the clock generator 20 outputs two different clock signals CLK1 and CLK2, but the number of clock signals generated by the clock generator 20 may be variously modified.

In an example embodiment, the integrated circuit 1000 may be a power management integrated circuit (PMIC) and may receive an input voltage from the outside and may provide a plurality of output voltages external of the PMIC and which are respectively suitable for driving a plurality of consumers. In an example embodiment, the integrated circuit 1000 may be implemented with various semiconductor devices.

The first oscillator 20_1 may generate a first clock signal CLK1 having a first frequency, and the second oscillator 20_2 may generate a second clock signal CLK2 having a second frequency. In this case, the first frequency may differ from the second frequency. In FIG. 9, two oscillators are illustrated, but the integrated circuit 1000 according to the inventive concepts may include three or more oscillators.

The clock monitoring circuit 10 may detect a duty ratio variation and a frequency variation of at least one of the first clock signal CLK1 and the second clock signal CLK2. For example, the clock monitoring circuit 10 may detect a duty ratio variation and a frequency variation of the first clock signal CLK1 by using the monitoring clock signal CLK_M. The clock monitoring circuit 10 may output a first duty ratio signal DRR1 based on the duty ratio variation of the first clock signal CLK1 and a first frequency detection signal FR1 based on the frequency variation of the first clock signal CLK1. Also, the clock monitoring circuit 10 may further output a second duty ratio signal DRR2 based on a duty ratio variation of the monitoring clock signal CLK_M and a second frequency detection signal FR2 based on a frequency variation of the monitoring clock signal CLK_M. In an example embodiment, the clock monitoring circuit 10 may be the clock monitoring circuit 10 of FIG. 1 and may include the first frequency detector 200_1 of FIG. 6 and at least one of the first duty ratio detector 100_1 of FIG. 2 and the first duty ratio detector 100_1a of FIG. 5.

The control logic 30 may receive the first clock signal CLK1 from the first oscillator 20_1 and may receive the second clock signal CLK2 from the second oscillator 20_2. The control logic 30 may receive the first duty ratio signal DRR1, the second duty ratio signal DRR2, the first frequency detection signal FR1, and the second frequency detection signal FR2 from the clock monitoring circuit 10.

The control logic 30 may determine the duty ratio variation and the frequency variation of the first clock signal CLK1 on the basis of the first duty ratio signal DRR1, the second duty ratio signal DRR2, the first frequency detection signal FR1, and the second frequency detection signal FR2. For example, when the first duty ratio signal DRR1 including a first signal DRRH1 having the second logic level (for example, a low level) and a second signal DRRL1 having the first logic level (for example, a high level) is received, the control logic 30 may determine that a duty ratio of the first clock signal CLK1 is less than a lower limit. Alternatively, for example, when the first duty ratio signal DRR1 including the first signal DRRH1 having the first logic level and the second signal DRRL1 having the second logic level is received, the control logic 30 may determine that a duty ratio of the first clock signal CLK1 is greater than an upper limit. Also, for example, when the first frequency detection signal FR1 having the second logic level is received, the control logic 30 may determine that a frequency of the first clock signal CLK1 is greater than an upper limit or less than a lower limit.

In an example embodiment, when it is determined that at least one of a duty ratio and a frequency of the first clock signal CLK1 varies excessively, the control logic 30 may restore the first clock signal CLK1.

The control logic 30 may determine a frequency variation of the second clock signal CLK2 on the basis of the first frequency detection signal FR1 and the second frequency detection signal FR2. For example, the control logic 30 may determine the frequency variation of the second clock signal CLK2 on the basis of a relationship between the first frequency and the second frequency. Alternatively, for example, the control logic 30 may determine the frequency variation of the second clock signal CLK2 on the basis of a relationship between a frequency of the monitoring clock signal CLK_M and the second frequency.

Figure 10:
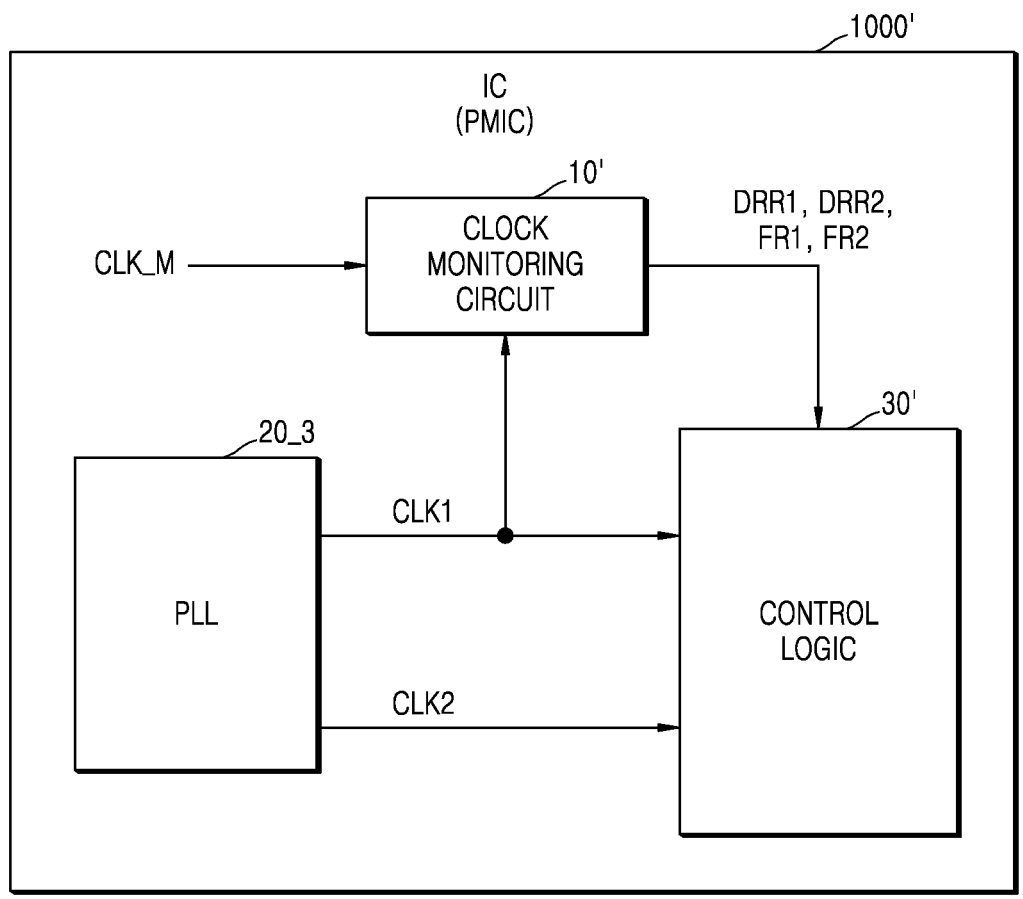
FIG. 10 illustrates a block diagram descriptive of an integrated circuit according to another example embodiment of the inventive concepts.

FIG. 10 illustrates a block diagram descriptive of an integrated circuit 1000' according to an example embodiment of the inventive concepts.

Referring to FIG. 10, the integrated circuit 1000' may include a clock monitoring circuit 10', a phase locked loop (PLL) 20_3, and a control logic 30'. In an example embodiment, the integrated circuit 1000' may be a PMIC. In an example embodiment, the integrated circuit 1000' may be implemented with various semiconductor devices.

The PLL 20_3 may receive a reference clock to generate a plurality of clock signals (for example, a first clock signal CLK1 and a second clock signal CLK2). In this case, a first frequency may differ from a second frequency.

The clock monitoring circuit 10' may detect a duty ratio variation and a frequency variation of at least one of the first clock signal CLK1 and the second clock signal CLK2. For example, the clock monitoring circuit 10' may detect a duty ratio variation and a frequency variation of the first clock signal CLK1 by using a monitoring clock signal CLK_M. The clock monitoring circuit 10' may output a first duty ratio signal DRR1 based on the duty ratio variation of the first clock signal CLK1 and a first frequency detection signal FR1 based on the frequency variation of the first clock signal CLK1. Also, the clock monitoring circuit 10' may further output a second duty ratio signal DRR2 based on a duty ratio variation of the monitoring clock signal CLK_M and a second frequency detection signal FR2 based on a frequency variation of the monitoring clock signal CLK_M. In an example embodiment, the clock monitoring circuit 10' may be the clock monitoring circuit 10 of FIG. 1 and may include the first frequency detector 200_1 of FIG. 6 and at least one of the first duty ratio detector 100_1 of FIG. 2 and the first duty ratio detector 100_1a of FIG. 5.

The control logic 30' may receive the first clock signal CLK1 and the second clock signal CLK2 from the PLL 20_3. The control logic 30' may receive the first duty ratio signal DRR1, the second duty ratio signal DRR2, the first frequency detection signal FR1, and the second frequency detection signal 1R2 from the clock monitoring circuit 10'.

The control logic 30' may determine the duty ratio variation and the frequency variation of the first clock signal CLK1 on the basis of the first duty ratio signal DRR1, the second duty ratio signal DRR2, the first frequency detection signal FR1, and the second frequency detection signal FR2. In an example embodiment, when it is determined that at least one of a duty ratio and a frequency of the first clock signal CLK1 varies excessively, the control logic 30' may restore the first clock signal CLK1.

The control logic 30' may determine a frequency variation of the second clock signal CLK2 on the basis of the first frequency detection signal FR1 and the second frequency detection signal FR2. For example, the control logic 30' may determine the frequency variation of the second clock signal CLK2 on the basis of a relationship between the first clock signal CLK1 and the second clock signal CLK2 (for example, a relationship between the first frequency and the second frequency).

Figure 11:
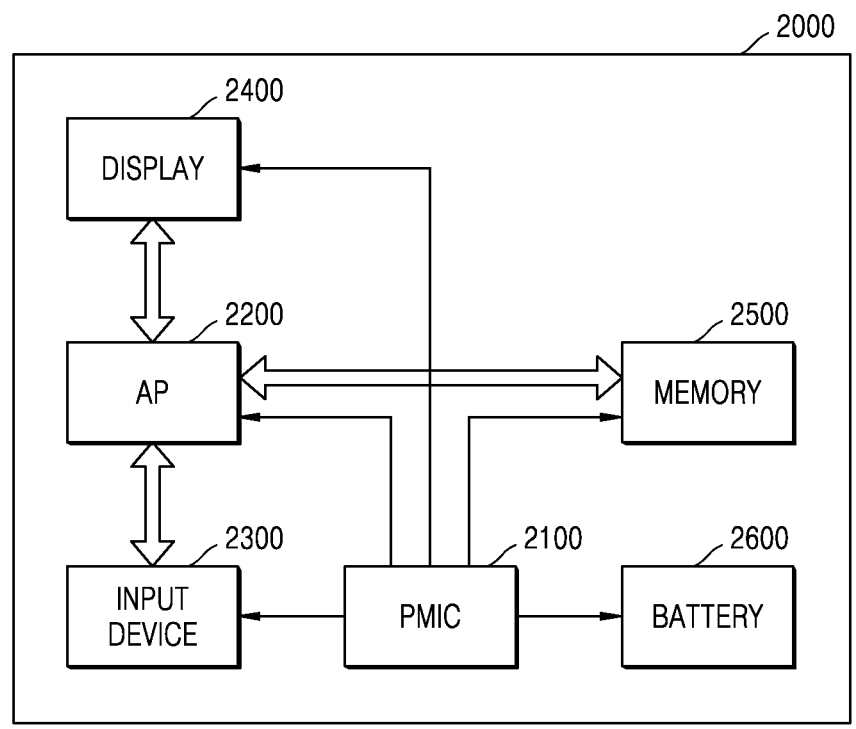
FIG. 11 illustrates a block diagram descriptive of an electronic device according to an example embodiment of the inventive concepts.

FIG. 11 illustrates a block diagram descriptive of an electronic device 2000 according to an example embodiment of the inventive concepts.

Referring to FIG. 11, the electronic device 2000 may include a PMIC 2100, an application processor (AP) 2200, an input device 2300, a display 2400, a memory 2500, and a battery 2600. For example, the electronic device 2000 may be a device included in a vehicle, or may be a smartphone, a personal computer (PC), a tablet PC, a netbook computer, an e-reader, a personal digital assistant (PDA), a portable multimedia player (PMP), an MP3 player, or the like. Also, the electronic device 2000 may be a wearable device such as an electronic bracelet or an electronic collar.

The PMIC 2100 may be supplied with power from the battery 2600 and may manage power of the AP 2200, the input device 2300, the display 2400, or the memory 2500. In an example embodiment, the PMIC 2100 may include at least one of the integrated circuit 1000 of FIG. 9 and the integrated circuit 1000' of FIG. 10.

The AP 2200 may control an overall operation of the electronic device 2000. In detail, the AP 2200 may display data, stored in the memory 2500, on the display 2400 according to an input signal generated by the input device 2300. For example, the input device 2300 may be implemented with a keypad, a keyboard, or a pointing device such as a touch pad or a computer mouse, or the like.

As described above, the example embodiments have been disclosed in the drawings and the specification. While the inventive concepts have been particularly shown and described with reference to exemplary embodiments thereof, it should be understood by those of ordinary skill in the art that various changes in form and detail may be made therein without departing from the spirit and scope of the inventive concepts as defined by the following claims. Therefore, it should be understood that various modifications and other equivalent embodiments may be implemented by those of ordinary skill in the art. Therefore, the spirit and scope of the inventive concepts should be defined by claims.

What is claimed is:

1. A clock monitoring circuit comprising:
   a first duty ratio detector configured to detect a variation of a duty ratio of a clock signal and to generate a first detection voltage indicative of the variation of the duty ratio of the clock signal, the first duty ratio detector further configured to output a first upper limit voltage and a first lower limit voltage corresponding to the first detection voltage;
   a second duty ratio detector configured to detect a variation of a duty ratio of a monitoring clock signal and to generate a second detection voltage indicative of the variation of the duty ratio of the monitoring clock signal, the second duty ratio detector further configured to output a second upper limit voltage and a second lower limit voltage corresponding to the second detection voltage; and
   a first frequency detector configured to receive the clock signal, the second upper limit voltage and the second lower limit voltage, and to detect a frequency variation of the clock signal based on the second upper limit voltage and the second lower limit voltage,
   wherein the first upper limit voltage has a level as high as a first upper limit level with respect to the first detection voltage, and the first lower limit voltage has a level as low as a first lower limit level with respect to the first detection voltage, and
   the second upper limit voltage has a level as high as a second upper limit level with respect to the second detection voltage, and the second lower limit voltage has a level as low as a second lower limit level with respect to the second detection voltage.

2. The clock monitoring circuit of claim 1, further comprising a second frequency detector configured to receive the monitoring clock signal, the first upper limit voltage and the first lower limit voltage, and to detect a frequency variation of the monitoring clock signal based on the first upper limit voltage and the first lower limit voltage.

3. The clock monitoring circuit of claim 1, wherein the first duty ratio detector comprises:
a low level detector configured to generate an off-duty width voltage corresponding to a length of a low level period of the clock signal;
a high level detector configured to generate an on-duty width voltage corresponding to a length of a high level period of the clock signal;
a boundary voltage generator configured to receive the off-duty width voltage and to generate the first upper limit voltage and the first lower limit voltage; and
a comparator circuit configured to compare the on-duty width voltage with the first upper limit voltage and the first lower limit voltage to generate and output the first detection voltage signal.

4. The clock monitoring circuit of claim 3, wherein the low level detector comprises:
a capacitor having first and second ends, wherein a voltage across the first and second ends increases during a low level period of the clock signal; and
a low pass filter configured to generate the off-duty width voltage using the voltage across the first and second ends of the capacitor.

5. The clock monitoring circuit of claim 1, wherein the first duty ratio detector comprises:
a low level detector configured to generate an off-duty width voltage corresponding to a low level period of the clock signal;
a high level detector configured to generate an on-duty width voltage corresponding to a high level period of the clock signal;
a boundary voltage generator configured to receive the on-duty width voltage and to generate the first upper limit voltage and the first lower limit voltage; and
a comparator circuit configured to compare the off-duty width voltage with the first upper limit voltage and the first lower limit voltage to generate and output the second detection voltage.

6. The clock monitoring circuit of claim 1, wherein the first frequency detector comprises:
a frequency extractor configured to generate a frequency detection voltage corresponding to a frequency of the clock signal; and
a comparator circuit configured to compare the frequency detection voltage with the second upper limit voltage and the second lower limit voltage to generate and output a frequency detection signal corresponding to the frequency variation of the clock signal.

7. The clock monitoring circuit of claim 6, wherein the frequency extractor comprises:
a capacitor having first and second ends, wherein a voltage across the first and second ends increases during a low level period of the clock signal; and
a low pass filter configured to generate the frequency detection voltage using the voltage across the first and second ends of the capacitor.

8. The clock monitoring circuit of claim 1, wherein the first upper limit level and the first lower limit level have a same value.

9. The clock monitoring circuit of claim 1, wherein the first upper limit level and the second upper limit level have a same value.

10. An integrated circuit including a clock monitoring circuit for monitoring a characteristic of a clock signal, the clock monitoring circuit comprising:
a first duty ratio detector configured to generate and output a first duty detection signal based on a variation of a duty ratio of a first clock signal on a basis of a first upper limit voltage and a first lower limit voltage;
a second duty ratio detector configured to generate and output a second duty detection signal based on a variation of a duty ratio of a monitoring clock signal on a basis of a second upper limit voltage and a second lower limit voltage; and
a first frequency detector configured to output a first frequency detection signal based on a frequency variation of the first clock signal on a basis of the second upper limit voltage and the second lower limit voltage,
wherein the first upper limit voltage has a level as high as a first upper limit level with respect to a voltage corresponding to the duty ratio of the first clock signal, and the first lower limit voltage has a level as low as a first lower limit level with respect to the voltage corresponding to the duty ratio of the first clock signal, and
the second upper limit voltage has a level as high as a second upper limit level with respect to a voltage corresponding to the duty ratio of the monitoring clock signal, and the second lower limit voltage has a level as low as a second lower limit level with respect to the voltage corresponding to the duty ratio of the monitoring clock signal.

11. The integrated circuit of claim 10, further comprising:
a first oscillator configured to generate the first clock signal; and
a second oscillator configured to generate a second clock signal having a frequency different from a frequency of the first clock signal,
wherein the clock monitoring circuit is configured to receive the first clock signal from the first oscillator.

12. The integrated circuit of claim 11, further comprising control logic configured to determine a frequency variation of the second clock signal on a basis of the first clock signal and the first frequency detection signal.

13. The integrated circuit of claim 10, further comprising a phase locked loop (PLL) configured to generate a plurality of clock signals having different frequencies,
wherein the clock monitoring circuit is configured to receive the first clock signal from among the plurality of clock signals from the PLL.

14. The integrated circuit of claim 10, wherein the integrated circuit comprises a power management integrated circuit (PMIC) configured to provide power external of the PMIC.

15. The integrated circuit of claim 10, wherein the clock monitoring circuit further comprises a second frequency detector configured to output a second frequency detection signal based on a frequency variation of the monitoring clock signal on a basis of the first upper limit voltage and the first lower limit voltage.

16. The integrated circuit of claim 10, wherein the first duty ratio detector comprises:

a low level detector configured to output an off-duty width voltage corresponding to a length of a low level period of the first clock signal;

a high level detector configured to output an on-duty width voltage corresponding to a length of a high level period of the first clock signal;

a boundary voltage generator configured to generate the first upper limit voltage and the first lower limit voltage from the off-duty width voltage; and a comparator circuit configured to compare the on-duty width voltage with the first upper limit voltage and the first lower limit voltage to output the first duty detection signal.

17. The integrated circuit of claim 10, wherein the first duty ratio detector comprises:

a low level detector configured to generate an off-duty width voltage corresponding to a length of a low level period of the first clock signal;

a high level detector configured to generate an on-duty width voltage corresponding to a length of a high level period of the first clock signal;

a boundary voltage generator configured to generate the first upper limit voltage and the first lower limit voltage from the on-duty width voltage; and a comparator circuit configured to compare the off-duty width voltage with the first upper limit voltage and the first lower limit voltage to output the first duty detection signal.

18. The integrated circuit of claim 10, wherein the first frequency detector comprises:

a frequency extractor configured to generate a frequency detection voltage corresponding to a frequency of the first clock signal; and a comparator circuit configured to compare the frequency detection voltage with the second upper limit voltage and the second lower limit voltage to generate and output the first frequency detection signal.

19. An integrated circuit comprising:

a clock generator configured to generate a clock signal; and a clock monitoring circuit configured to monitor a duty ratio and a frequency of the clock signal, wherein the clock monitoring circuit comprises:

a first duty ratio detector configured to detect a variation of a duty ratio of the clock signal and to generate a first detection voltage indicative of the variation of the duty ratio of the clock signal, the first duty ratio detector further configured to output a first upper limit voltage and a first lower limit voltage corresponding to the first detection voltage;

a second duty ratio detector configured to detect a variation of a duty ratio of a monitoring clock signal and to generate a second detection voltage indicative of the variation of the duty ratio of the monitoring clock signal, the second duty ratio detector further configured to output a second upper limit voltage and a second lower limit voltage corresponding to the second detection voltage;

a first frequency detector configured to receive the clock signal, the second upper limit voltage and the second lower limit voltage, and to detect a frequency variation of the clock signal based on the second upper limit voltage and the second lower limit voltage; and a second frequency detector configured to receive the monitoring clock signal, the first upper limit voltage and the first lower limit voltage, and to detect a frequency variation of the monitoring clock signal based on the first upper limit voltage and the first lower limit voltage.

20. The integrated circuit of claim 19, wherein the first upper limit voltage has a level as high as a first upper limit level with respect to the first detection voltage, and the first lower limit voltage has a level as low as a first lower limit level with respect to the first detection voltage, and the second upper limit voltage has a level as high as a second upper limit level with respect to the second detection voltage, and the second lower limit voltage has a level as low as a second lower limit level with respect to the second detection voltage.

\* \* \* \* \*